(12) United States Patent
Ito et al.

(10) Patent No.: US 6,231,917 B1
(45) Date of Patent: May 15, 2001

(54) METHOD OF FORMING LIQUID FILM

(75) Inventors: Shinichi Ito; Katsuya Okumura, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/335,508

(22) Filed: Jun. 18, 1999

(30) Foreign Application Priority Data

Jun. 19, 1998 (JP) .................................................. 10-173021
Jun. 30, 1998 (JP) .................................................. 10-185133

(51) Int. Cl.$^7$ ....................................................... B05D 3/14
(52) U.S. Cl. ............................... 427/9; 427/58; 427/117; 427/256; 427/258; 427/261; 427/407.1; 427/420; 427/430.1; 427/510; 427/553
(58) Field of Search ...................................... 427/510, 117, 427/420, 256, 553, 9, 58, 430.1, 258, 261, 407.1

(56) References Cited

U.S. PATENT DOCUMENTS

| | | | |
|---|---|---|---|
| 4,381,726 | * | 5/1983 | Hojberg . |
| 5,002,800 | * | 3/1991 | Uehara et al. . |
| 5,413,818 | * | 5/1995 | Suga et al. . |
| 5,505,995 | * | 4/1996 | Leonard . |
| 5,885,659 | * | 3/1999 | Takahashi et al. . |

FOREIGN PATENT DOCUMENTS

| | | |
|---|---|---|
| 2-220428 | 9/1990 | (JP) . |
| 6-151295 | 5/1994 | (JP) . |
| 7-321001 | 12/1995 | (JP) . |

* cited by examiner

*Primary Examiner*—Bernard Pianalto
(74) *Attorney, Agent, or Firm*—Finnegan, Henderson, Farabow, Garrett & Dunner, L.L.P.

(57) ABSTRACT

A liquid output portion is arranged above a substrate. In the substrate, a film formation region and a non-film-formation region are determined. The liquid output portion is responsible for continuously outputting a liquid in a constant amount to the substrate. The substrate and the liquid output portion are relatively moved by a moving portion. Below the liquid output portion, a liquid shut-out portion is arranged. At least one of the substrate and the liquid output portion is moved and ready to supply of the liquid from the liquid output portion to the non-film-formation region, the supply is shut out by the liquid shut-out portion. A liquid, which has been controlled so as to spread in a constant amount, is continuously output from the liquid output nozzle to the substrate. While the nozzle and the substrate are relatively moved, the liquid is supplied to a first region on the substrate. While the nozzle and the substrate are relatively moved, the liquid is supplied to a second region on the substrate in such a way that the liquid supplied from the nozzle and spread in a second region on the substrate is in contact with the liquid which has supplied and spread in the first region on the substrate. In the case where projections and depressions are formed on the surface of the substrate, an amount of the liquid to be supplied to the substrate is varied depending upon the ratio between the projections and depressions.

22 Claims, 15 Drawing Sheets

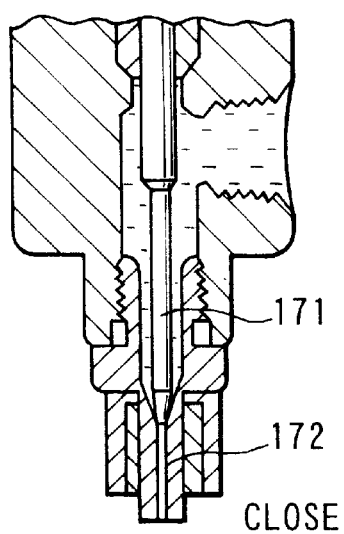
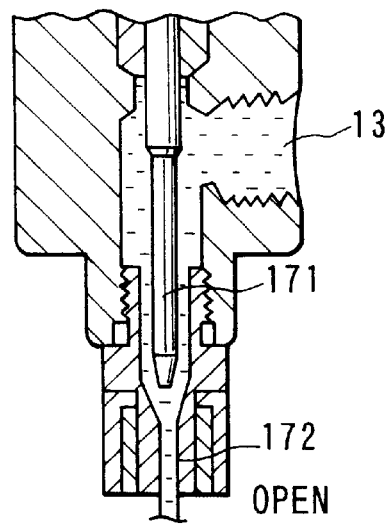
FIG. 1A     FIG. 1B
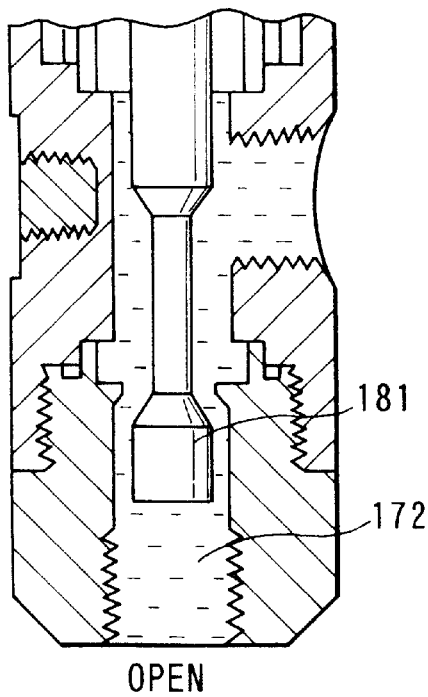
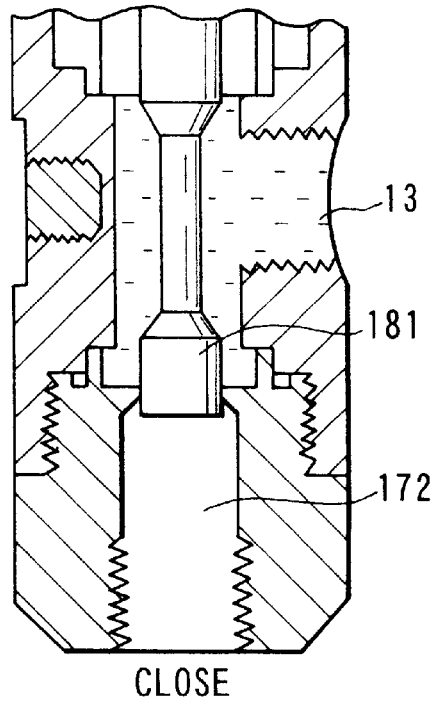
FIG. 2A     FIG. 2B

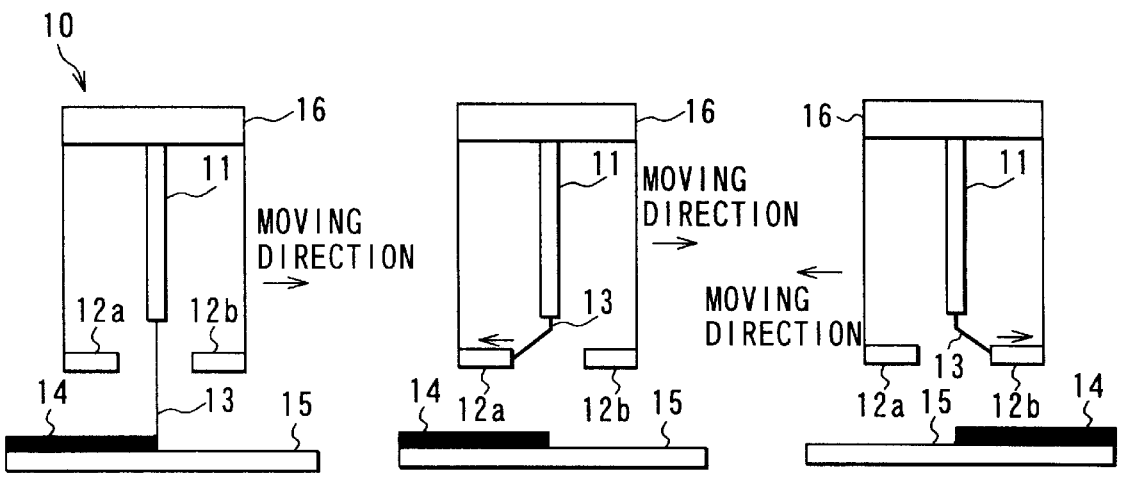
FIG. 5A   FIG. 5B   FIG. 5C
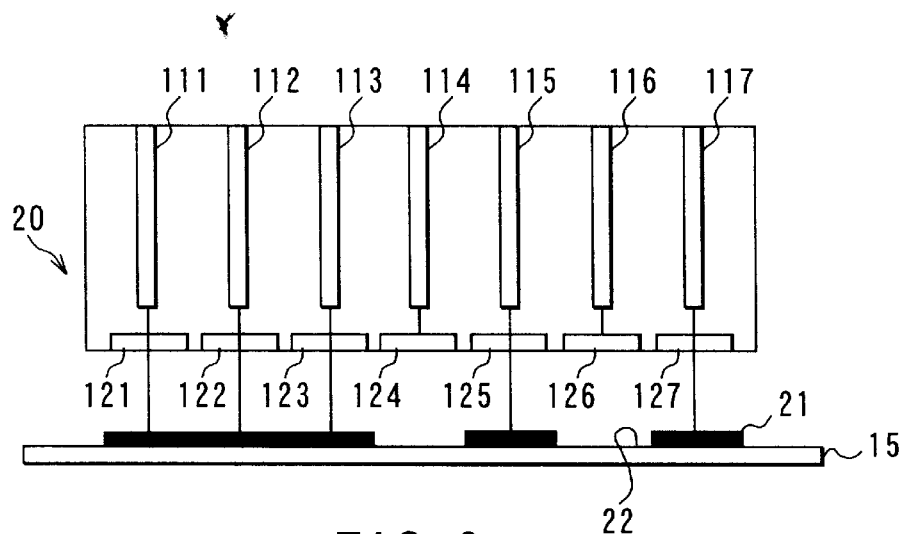
FIG. 6
 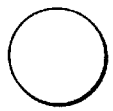 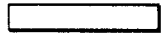 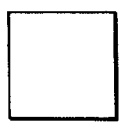
FIG. 7A   FIG. 7B   FIG. 7C   FIG. 7D

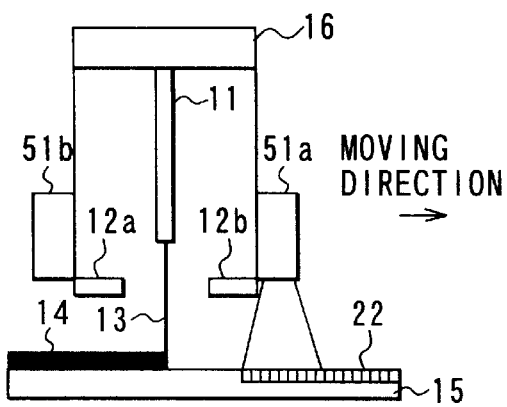
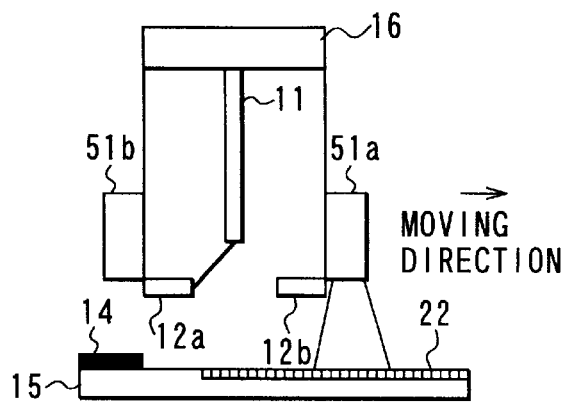
FIG. 9A  FIG. 9B
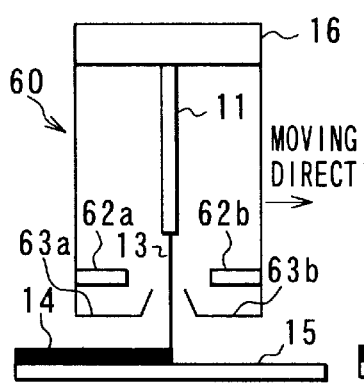
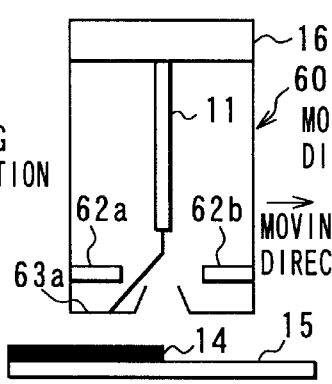
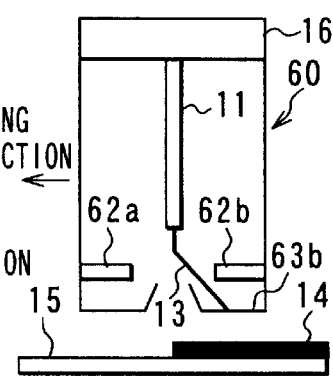
FIG. 10A  FIG. 10B  FIG. 10C
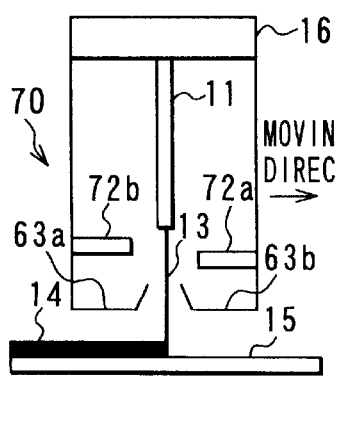
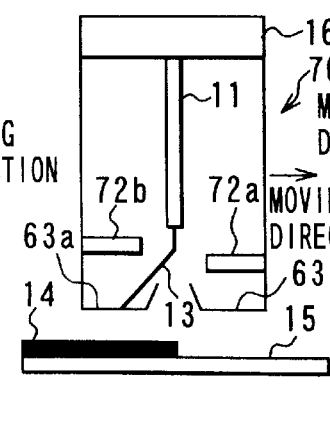
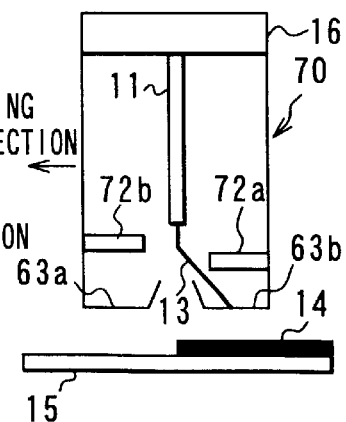
FIG. 11A  FIG. 11B  FIG. 11C

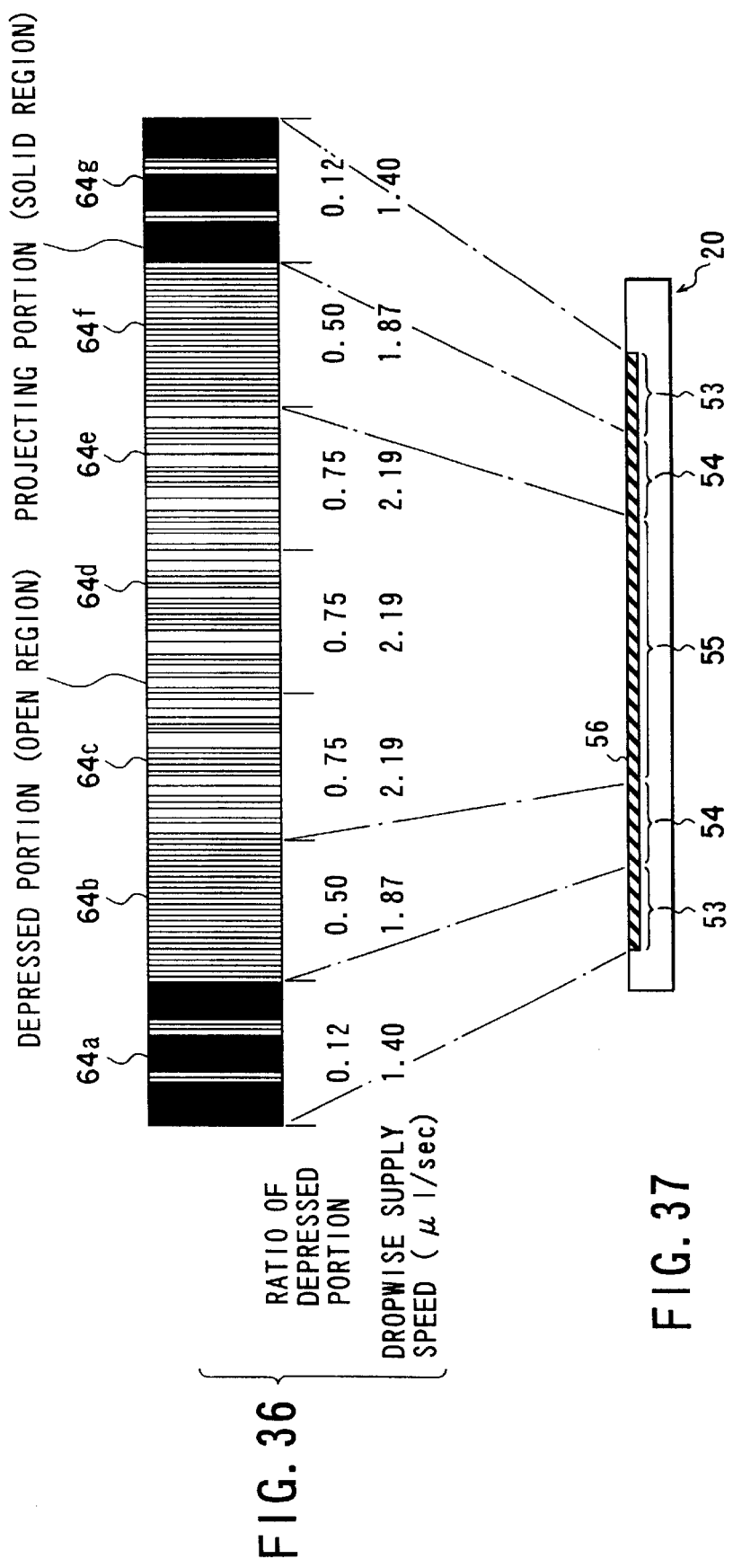

METHOD OF FORMING LIQUID FILM

BACKGROUND OF THE INVENTION

The present invention relates to a technique for forming a liquid film by supplying a liquid onto a substrate to be processed, and more specifically, to an apparatus and method of selectively forming the liquid film on the substrate.

In a manufacturing step of the semiconductor device, a liquid such as a resist or an SOG (Spin on Glass) solution is coated on a substrate. In a spin-coating method which has been conventionally used in a lithographic process to coat the liquid on the substrate, almost all amount of the liquid supplied onto the substrate is discarded out of the substrate and the remainder (several %) held on the substrate is used in forming a film. Therefore, a large amount of the liquid (such as a chemical agent) is wasted. Furthermore, a large amount of the chemical agent is released outside, negatively affecting the environment. In the case where a rectangular substrate or a large-aperture disk-form substrate (12 inches or more) is used, a turbulence is generated around the substrate, with the result that the obtained film is not uniform at outer peripheral portion thereof.

As a method of coating the chemical agent uniformly over the main surface of a substrate while the chemical agent is not wasted, Japanese Patent Application KOKAI Publication No. 2-220428 discloses a method of forming a uniform film by supplying a resist from a plurality of nozzles arranged in line and then blowing a gas or a liquid to the film formation surface behind the resist. Japanese Patent Application KOKAI Publication No. 6-151295 discloses a method of forming a uniform film by spraying a resist to a substrate from a plurality of spray holes formed in a rod. Japanese Patent Application KOKAI Publication No. 7-321001 discloses a method of forming a uniform film by moving a spray head having numeral spray holes for spraying a resist relative to a substrate. All of the coating apparatuses mentioned are directed to the formation of a uniform film by moving output nozzles or spray nozzles arranged laterally in line in a scanning manner along a substrate surface.

To use the chemical agent without waste, a method has been proposed in which a liquid film is formed by supplying a liquid from a nozzle selectively to a film formation region of the substrate. As such a selective film formation method using a liquid supply nozzle, known is a method using an accurate coating nozzle (manufactured by EFD CO., Ltd.) in which output of the liquid can be controlled in an ON/OFF manner.

In the method using the accurate coating nozzle, a liquid 13 is shut out by driving a valve such as a needle 171 or a screw 181, which is provided within a nozzle positioned above an output port 172, as shown in FIGS. 1 and 2.

This system has a problematic phenomenon where particles are generated by friction between the valve and the liquid when the valve is driven, and the particles are delivered to the substrate by being contained in a liquid supplied dropwise onto the substrate when the valve is opened. This system has another problematic phenomenon where pressure applied to the liquid slightly changes immediately after the valve is opened and thereby a pulsation flow occurs. Due to the pulsation flow, the thickness of the formed film changes.

More specifically, if a liquid film is selectively formed on the substrate while controlling output of the liquid by operating the valve arranged before the output port, as described, a problem of liquid-film contamination with the particles comes up. In addition, if the pulsation flow occurs, the liquid film is formed non-uniformly in thickness.

If the substrate has an uneven surface due to various patterns formed thereon, the following problems come up.

As shown in FIG. 3, if constructs 102 are formed on a substrate 101 and the ratio of the depressed portion is different depending on regions of the substrate surface, the thickness of films 103a, 103b, and 103c differs. In this case, the surfaces of the films are not formed uniform. Then, if the structure shown in FIG. 3 is subjected to a reflow processing, the resultant films, for example, insulating films 104a, 104b, and 104c, can be flattened, as shown in FIG. 4A.

However, depending upon the difference in ratio of the depressed portion, the insulating films 104a, 104b, 104c differ in surface level (height). Therefore, when resist patterns 106a–106c are formed on the insulating films 104a–104c with an antireflection film 105 interposed between them and exposed to light, some of them are defocused. The resist patterns 106a–106c obtained after the light exposure have a problem in that line widths thereof drastically vary each other as shown in FIG. 4B.

In brief, as described, the spin-rotation method has a problem in that almost all amount of liquid supplied dropwise on the substrate is wasted. On the other hand, the method of supplying the liquid dropwise onto the substrate has a problem in that the formed liquid film differs in height (level) from the substrate depending upon projections and depressions of the pattern formed on the substrate. In other words, the formed liquid film is non-uniform in thickness measured from the substrate surface.

BRIEF SUMMARY OF THE INVENTION

A first object of the present invention is to provide an apparatus and method for selectively forming a liquid film on a substrate in a uniform thickness while suppressing contamination of the liquid film with impurities. A second object of the present invention is to provide a method of forming a liquid film having a flat surface even on both projections and depressions by coating a liquid on a substrate efficiently without influence from the projections and depressions attributed to patterns formed on the substrate.

The present invention is constituted as described below to attain the first object.

(1) According to the present invention, there is provided an apparatus for forming a film, comprising:

a liquid output portion arranged above a substrate in which a predetermined film formation region and a predetermined non-film-formation region are defined, for continuously outputting a liquid to the substrate in a constant amount;

a moving portion for relatively moving the liquid output portion and the substrate; and a liquid shut-out portion arranged between the liquid output portion and the substrate, for shutting out supply of the liquid to the non-film-formation region when at least one of the substrate and the liquid output portion is moved and ready to supply the liquid output from the liquid supply portion to the non-film-formation region.

Preferred embodiments of constitution (1) will be described below.

The liquid shut-out portion comprises a liquid suction portion for sucking the liquid output from the liquid output portion, from a side of a liquid flow, and a liquid collection portion for collecting the liquid sucked.

The liquid shut-out portion comprises a gas blow-out portion for blowing out a gas to a side of a liquid output from the liquid output portion and a liquid collection portion arranged so as to sandwich the output liquid with the gas blow-out portion below the gas blow-out portion, for collecting the liquid to which the gas is blown out.

The liquid shut-out portion comprises a light emitting portion for emitting light for initiating a reaction of a gas generating material;

a light controlling portion for controlling a direction of light emitted from the light emitting portion;

a gas blow-out portion having the gas generating material for generating a gas upon receipt of light controlled by the light controlling portion and blowing out the gas generated to a side of the liquid output from the liquid output portion; and a liquid collection portion arranged so as to sandwich the output liquid with the gas blow-out portion, for collecting the liquid to which the gas is blown out.

The liquid shut-out portion comprises a shut-out plate arranged between the liquid output portion and the substrate, for changing a flow of the liquid output form the liquid output portion;

a shut-out plate driving portion for loading and unloading the shut-out plate across the flow of the liquid output from the liquid output portion; and a liquid collection portion for collecting the liquid whose flowing direction is changed by the shut-out plate.

Furthermore, to the liquid shut-out portion, an image taking section is connected which is arranged in front of a moving direction of the liquid output portion, for taking an image data of the surface of the substrate, and the liquid shut-out portion identifies the non-film-formation region on the basis of the image data taken and a predetermined pattern design data and shuts out supply of the liquid.

(2) According to the present invention, there is provided a method of forming a film comprising the steps of:

outputting a constant amount of a liquid constantly from a liquid output nozzle to a substrate having a predetermined film formation region and a predetermined non-film-formation region defined therein;

supplying the liquid output from the liquid output nozzle to the film formation region on the substrate by relatively moving the liquid output nozzle and the substrate; and collecting the liquid by changing a direction of a flow of the liquid output from the liquid output nozzle to a direction parallel to a direction of a relative movement of the liquid output nozzle and the substrate by using a liquid shut-out portion arranged between the liquid output nozzle and the substrate and stopped relatively to the liquid output nozzle, and thereby shutting out supply of the liquid to a non-film-formation region of the substrate.

Preferred embodiments of constitution (2) will be described below.

The non-film-formation region is at least one of a region including an alignment mark to be used in alignment in a light exposure step and a region of the substrate to be processed. The "region of the substrate to be processed" is a region to be etched and includes a region such as an outer peripheral portion of a wafer, on which a chip is not formed.

As the liquid, any one of an antireflection material, a resist material, low dielectric material, an insulating material and a wiring material added to a solvent, is used. Note that the material to be added is not limited to the aforementioned materials. As the liquid, a solvent containing an arbitrarily chosen material dissolved therein, such as a metal paste, may be used.

The present invention has the following functions and effects by virtue of the aforementioned constitutions.

The liquid can be shut out by controlling an output amount of the liquid from the nozzle constant and shutting out the output liquid by the liquid shut-out portion provided below the nozzle without generation of particles. Furthermore, it is possible to supply the liquid uniformly to the substrate without generating a pulsation flow by shutting out the liquid by the liquid shut-out portion, immediately before the liquid is shut out, after the shut-out is completed and at the time liquid supply is reinitiated.

No valve is used, so that no pulsation flow is generated in the liquid. As a result, it is possible to form a liquid film having a uniform thickness. Furthermore, the supply of the liquid to the substrate is shut out by bending the supply direction of the liquid in a direction parallel to the moving direction of the apparatus. When the liquid is shut out, the liquid is not scattered out laterally from the moving direction. It is therefore possible to form a liquid film having a uniform thickness.

Since the supply of the liquid onto the substrate is shut out after the liquid is output from the nozzle, no particles are generated and therefore contamination of the liquid film with particles does not take place.

Furthermore, it is possible to reduce an amount of the liquid to be used by shutting out the supply of the liquid from the liquid supply nozzle by the liquid shut-out portion.

The present invention is constituted as described below to attain the second object.

(3) According to the present invention, there is provided a method for forming a film comprising the steps of:

outputting a liquid, which is controlled to be spread in a constant amount on a substrate, continuously to the substrate from a liquid output nozzle;

moving the liquid output nozzle and the substrate, relatively to supply the liquid to a first region on the substrate; and supplying the liquid to a second region on the substrate by moving the liquid output nozzle and the substrate relatively in such a way that a liquid supplied from the liquid output nozzle and spread on the substrate comes into contact with the liquid which has been supplied and spread in the first region on the substrate.

Preferred embodiments of constitution (3) will be shown below.

When projections and depressions are formed on a surface of the substrate, an amount of the liquid to be supplied onto the substrate is changed depending upon the ratio between the projections and depressions.

The amount of the liquid to be supplied onto the substrate is changed by changing an output amount from the liquid output nozzle.

The amount of the liquid to be supplied onto the substrate is changed by changing a moving speed of the liquid output nozzle relative to the substrate while the amount of the liquid output from the liquid output nozzle is maintained constant.

The output amount is changed by changing a deliver amount from the liquid deliver pump arranged at an upstream side of the liquid output nozzle.

In the step of supplying the liquid to the first region on the substrate, the liquid is supplied in a first supply direction from an edge of an outer periphery of the substrate toward inside while the liquid output nozzle is reciprocally moved in a direction perpendicular to the first supply direction and simultaneously moves in the first supply direction at predetermined pitches when it reaches a point of return.

In the step of supplying the liquid to the second region, the liquid is supplied in a second supply direction from another edge of the periphery of the substrate to the inner portion thereof so as not to overlap the first region while the liquid output nozzle moves reciprocally in a direction perpendicular to the second supply direction and simultaneously moves to the second supply direction at predetermined pitches when it reaches a point of return.

The amount of the liquid to be spread is controlled by controlling at least one selected from an amount of a solid matter contained in the liquid, a viscosity and an output speed of the liquid, and a relative moving speed of the liquid output nozzle and the substrate.

A plurality of liquid output nozzles are arranged in a direction perpendicular to a moving direction of the liquid output nozzle relative to the substrate, for changing amounts of the liquid output nozzles.

The ratio between projections and depressions is determined from pattern design data of the substrate.

The ratio between projections and depressions is determined from an image of a surface of the substrate taken by an image taking section arranged in front of a moving direction of the liquid output nozzle.

As the liquid, any one of a low dielectric material an insulating material, an antireflection material, a resist material, and a wiring material added in a solvent, is used. Note that a raw material to be added is not limited to the aforementioned materials. As the liquid, a solvent containing any arbitrarily chosen material dissolved therein, for example, a metal paste, may be used.

The present invention has the following functions and effects by the aforementioned constitution.

In the present invention, a liquid is supplied from a liquid supply nozzle onto a substrate placed right below the liquid supply nozzle. In this case, the output liquid is held on the substrate to thereby supply only a necessary solid matter to the substrate. Accordingly, it is possible to reduce the cost for materials. In addition, the amount of waste materials is reduced, with the result that adverse effects on the environment can be drastically lowered.

Furthermore, a film having a flat surface can be formed on both depressed portion and projecting portion by changing a relative moving speed of the substrate and the liquid output nozzle, a moving pitch of the nozzle or an output amount of the liquid from the nozzle depending upon the ratio between projections and depressions of the substrate or a desired film thickness.

Furthermore, the present invention can be attained by using a method of shutting out the liquid supplied dropwise. To describe more specifically, the film having a flat surface can be formed both on a depressed portion and a projecting portion by controlling a supply amount of the liquid by intermittently shutting out the liquid to be supplied from the nozzle to the substrate while the substrate and the liquid output nozzle are relatively moved depending upon the ratio between depressions and projections of the substrate or a desired film thickness. More specifically, the surface of the formed film can be flattened by increasing a supply amount of the liquid and spreading the liquid on the substrate surface by reducing the number of shut-out operation in the depressed portion and by decreasing a supply amount and spreading the liquid on the substrate surface by increasing the number of shut-out operation in the projecting portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are cross-sectional views showing a structure of a coating nozzle conventionally used;

FIGS. 2A and 2B are cross-sectional views showing another coating nozzle conventionally used;

FIGS. 5A, 5B, 5C are cross-sectional views showing a liquid supply unit according to a first embodiment of the present invention;

FIG. 6 is a cross-sectional view showing a structure of a liquid film formation apparatus using the multiple liquid supply units;

FIGS. 7A, 7B, 7C and 7D show shapes of an output port of a liquid supply nozzle of the liquid supply unit;

FIGS. 9A and 9B are cross-sectional views showing a structure of a liquid supply unit having a pattern identification means;

FIGS. 10A, 10B, 10C are cross-sectional views showing a structure of a liquid supply unit having a liquid suction portion and a liquid collection portion;

FIGS. 11A, 11B, 11C are cross-sectional views showing a structure of a liquid supply unit having a gas-blowing portion and a liquid collection portion;

FIGS. 24, 24B and 24C are cross-sectional views of an apparatus and a substrate showing a structure of a liquid film formation apparatus according to a fifth embodiment of the present invention;

FIG. 36 is diagram showing an output amount (drip speed) of a liquid supply nozzle to a projection/depression pattern on the substrate; and FIG. 37 is a cross-sectional view of a substrate coated by the coating apparatus of FIG. 35.

DETAILED DESCRIPTION OF THE INVENTION

Figure 3:
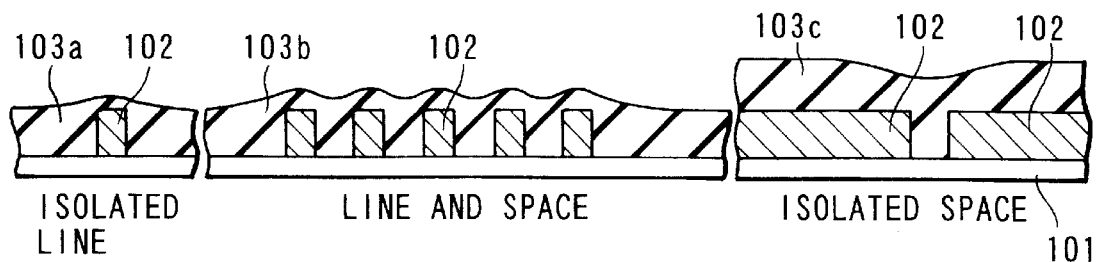
FIG. 3 is a cross-sectional view showing a structure of a film formed by a conventionally used coating apparatus
Figure 4A:
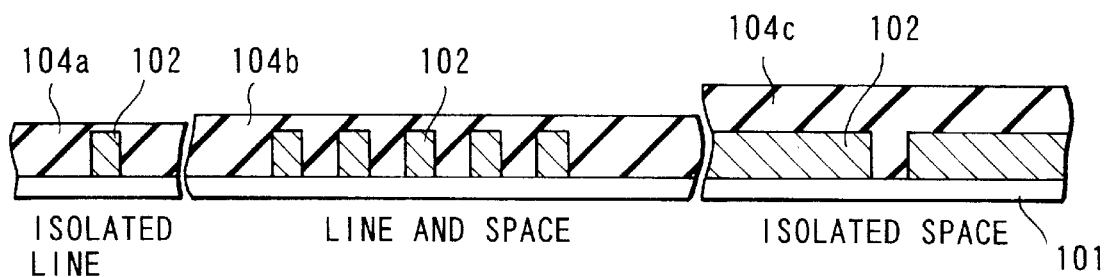
FIGS. 4A and 4B are cross-sectional views showing a structure of a film formed by subjecting the structure shown in FIG. 3 to a reflow processing.
Figure 4B:
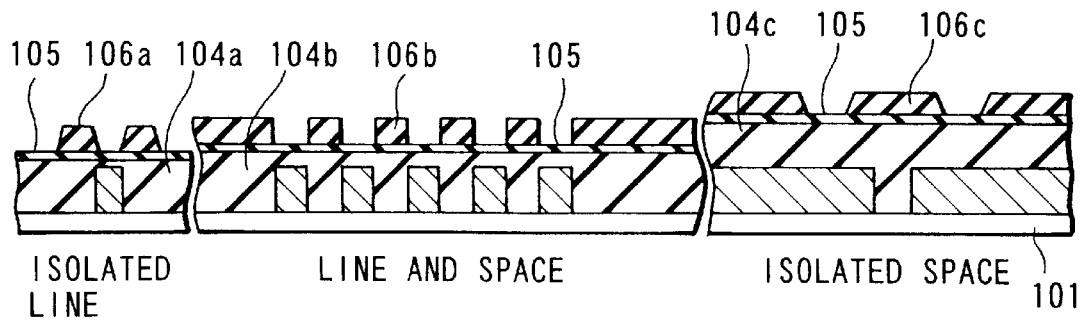

Embodiments of the present invention will be explained with reference to the drawing.

[First Embodiment]

This embodiment relates to a method of forming an antireflection film. In this embodiment, we will explain a method of forming a film selectively on a substrate except a non-film-formation region (an alignment mark, an outer edge portion of the substrate, or non-patterning region where a chip is not formed).

First, we will explain a structure of a liquid film formation apparatus for forming a liquid film by supplying a liquid selectively onto a substrate to be processed.

FIGS. 5A, 5B, 5C are cross-sectional views showing a structure of a liquid supply unit according to a first embodiment of the present invention.

As shown in FIG. 5A, a substrate 15 is mounted on a holder (not shown). A liquid supply unit 10 for selectively forming a liquid film on the substrate is positioned right above the substrate 15. The liquid supply unit 10 has a liquid supply nozzle 11 and liquid suction portions 12a, 12b. The liquid supply nozzle 11 is responsible for outputting a liquid 13 to the substrate 15. The liquid suction portions 12a, 12b suck the liquid 13 output from the liquid supply nozzle 11, so that the supply of the liquid 13 from the nozzle 11 to the substrate 15 is shut out. In short, the liquid 13 is sucked by the liquid suction portions 12a, 12b and collected from the suction port.

The liquid supply unit 10 has a unit moving portion 16 for moving the liquid supply unit 10. While the liquid supply unit 10 is moved by the unit moving portion 16, the liquid 13 is allowed to output from the liquid supply nozzle 11 to the substrate 15. In this manner, a liquid film 14 is formed on the substrate 15.

Incidentally, two liquid suction portions 12a, 12b are arranged in parallel to the moving direction of the liquid supply unit 10 and so as to sandwich the liquid 13 supplied dropwise. If the liquid supply unit 10 moves, for example, to the right-hand side of the paper, the liquid is sucked by the liquid suction portion 12a, which is positioned at the back side of the moving direction as shown in FIG. 5B. In this manner, the supply of the liquid 13 to the substrate 15 is shut out. On the other hand, the liquid supply unit 10 moves to the left-hand side of the paper, the liquid 13 is sucked by the liquid suction portion 12b positioned at a back side of the moving direction. In this manner, the supply of the liquid 13 to the substrate 15 is shut out.

Now, referring to FIG. 6, we will explain a liquid film formation apparatus 20 having a plurality of liquid supply units so as to form a film a selectively on a broad region on the substrate at one time. FIG. 6 is a cross-sectional view of the apparatus 20 viewed from a position in front of the moving direction. The liquid supply units independently have a liquid supply nozzle 111 & a liquid suction portion 121, a nozzle 112 & a suction portion 122, a nozzle 113 & a suction portion 123, a nozzle 114 & a suction portion 124, a nozzle 115 and a suction portion 125, a nozzle 116 & a suction portion 126, and a nozzle 117 & a suction portion 127. These liquid supply units are arranged in the direction perpendicular to the moving direction thereof. Using the liquid film formation apparatus 20 having such liquid supply units, a film is formed selectively on a film formation region 21 and a non film-formation region 22 by independently controlling operations (suction) of the liquid suction portions 121–127 corresponding to liquid supply nozzles 111–117.

Individual nozzles 111–117 are arranged at intervals of 100 $\mu$m. The intervals of individual nozzles 111–117 may be arbitrarily varied depending upon an output region. Furthermore, shape of ports of these nozzles 111–117 is an ellipse having a short axis (20 $\mu$m)×a long axis (40 $\mu$m) as shown in FIG. 7A (in this case, the long axis is positioned in the same direction as the nozzle arrangement direction). As the shape of ports of the nozzles 111–117, a circle (FIG. 7B), a rectangle (FIG. 7C), right square (FIG. 7D) may be used.

Next, referring to FIGS. 8A–8D, we will explain how to selectively form a liquid film by use of the liquid film formation apparatus 20 shown in FIG. 6. Note that, in FIGS. 8A, 8B, 8C and 8D, the apparatus is moved to the fore side of the paper. Hereinbelow, we will explain the case where an antireflection film is formed by coating a solution containing an antireflection material on the substrate. To obtain the antireflection film having a film thickness of 0.055 µm, a solid matter of antireflection material contained in a solvent is adjusted at 0.5% and a moving speed of the liquid film formation apparatus is set at 100 mm/sec.

A film is formed by moving the liquid film formation apparatus 20 reciprocally in a line (row) direction and simultaneously in a row (line) direction with respect to the substrate 15. In the case where non film-formation region is not included, a whole amount of an antireflection solution 411 output from the liquid supply nozzles 111–117 is supplied to the substrate 15 and spread over the substrate 15 to thereby form a liquid film 412.

Figure 8A:
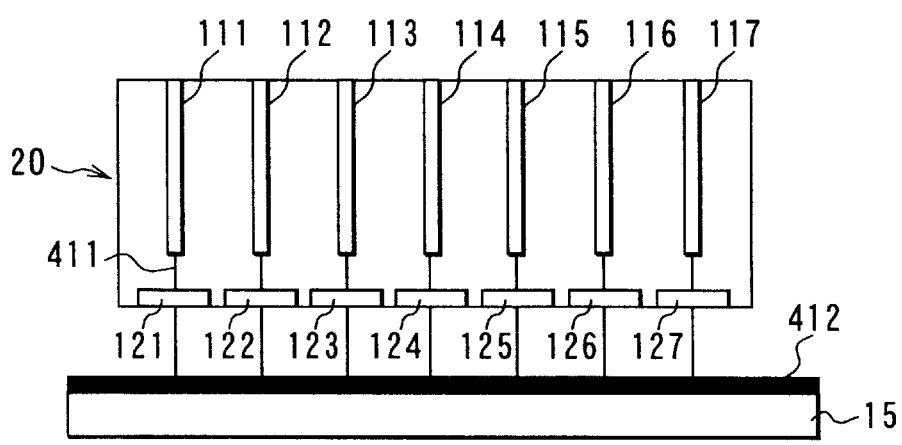
FIGS. 8A, 8B, 8C and 8D are cross-sectional views of an apparatus and a substrate in a step of selectively forming a liquid film using the liquid film formation apparatus.
Figure 8B:
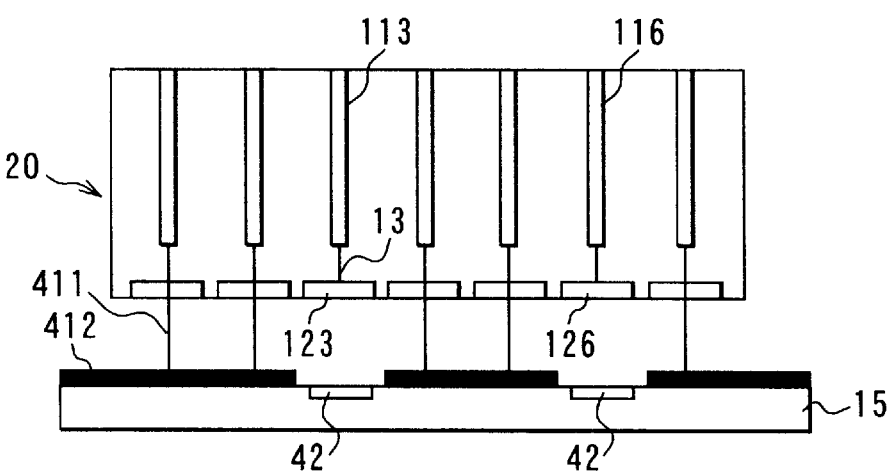

When the film formation apparatus 20 comes immediately before an alignment mark 42, the following operation is performed. As shown in FIG. 8B, when the liquid suction portions 123, 126 corresponding to the liquid supply nozzles 113, 116, which are positioned immediately above the alignment marks 42, initiate suction of the antireflection solution 411, supply of the antireflection solution 411 onto the alignment mark 42 is shut out. The suction of the antireflection solution 411 is continued until the film formation apparatus 20 exceeds over the alignment mark 42. The presence and absence of the alignment mark 42 is identified based on pattern design data of the substrate 15.

In this embodiment, when the liquid discharged from the liquid supply nozzles 111–117 is shut out by the liquid suction portions 121–127, no pulsation flow is generated in the liquid. It is therefore possible to form a liquid film uniform in thickness. Furthermore, when the flowing direction of the liquid is bent in a direction in parallel to the moving direction of the apparatus, the supply of the liquid to the substrate is shut out. When the liquid is shut out, the liquid does not scatter laterally with respect to the moving direction. It is therefore possible to form the liquid film uniform in thickness.

In this embodiment, the supply of the antireflection solution is not shut out by mechanically closing the nozzle ports. Therefore, particles are not generated, with the result that the antireflection solution will not contaminated with the particles.

Figure 8C:
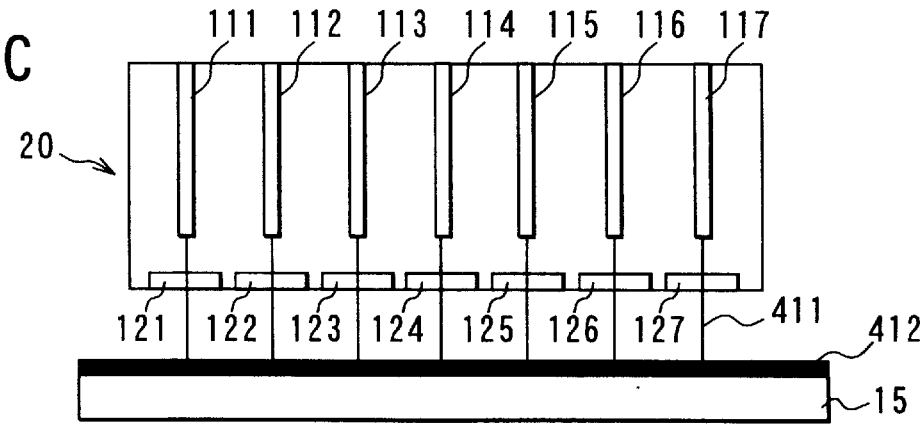

When the apparatus exceeds over the alignment mark 42, the suction by the liquid suction portions 123, 126 corresponding to the nozzles 113, 116 are terminated as shown in FIG. 8C, and then the supply of the antireflection solution 411 is initiated from the nozzles 113, 116 to the substrate 15.

Figure 8D:

Thereafter, after an antireflection solution film 412 is selectively formed on the film formation region of the substrate 15, a solvent is vaporized by baking to form the antireflection film 413 having a desired film thickness, as shown in FIG. 8D. In the same manner as in the formation of the antireflection film 413, a resist film is formed selectively on the substrate except the alignment mark and the region outside the chip formation region. A resist film is formed in a film thickness of 0.3 µm by setting a solid matter of the resist material at 1.5% and a moving speed of the film formation apparatus 20 at 50 mm/sec.

In this embodiment, it is designed that the antireflection film and the resist film are not formed on the alignment mark. Therefore, the accuracy in alignment can be dramatically improved during the light exposure. The improvement of accuracy in alignment influences devise designing, with the result that difference in electric properties depending upon devices can be reduced and a chip area can be further reduced.

In this case, diluted solutions of the antireflection material and the resist material are used as the liquid, however, the liquid is not limited to these. As the liquids to be used in the present invention, solutions containing a conductive material, an interlayer insulating material, and a wiring material, and molten solution of these materials themselves, may be used. The liquid used herein may include a thinner-diluted solution or a molten raw material.

The non film-formation region such as the alignment mark is identified with reference to a pattern design data or a pattern image taken by a pattern identification means 51a, 51b as shown in FIGS. 9A, 9B. The pattern identification means 51a, 51b are set in front of the moving direction (indicated by an arrow in the figure) of the liquid supply nozzle 11 to take a pattern present in the front of the moving direction. The pattern identification means 51b is used when the apparatus moves in a backward direction. The pattern identification means 51a (51b) consists of a CCD camera, an image fiber, or the like.

In the aforementioned embodiment, the liquid is directly sucked by a liquid shut-out portion. However, the present invention is not limited to this. For example, a liquid film formation apparatus 60 may be used which has liquid suction portions 62a, 62b and liquid collection portions 63a, 63b, as shown in FIG. 10A. The liquid collection portions 63a, 63b are provided below the suction portions 62a, 62b, respectively, so as to sandwich the liquid 13 between them. In the film formation apparatus 60 of the present invention, the liquid 13 supplied dropwise is attracted to the suction portion 62a (or 62b) by suction and the attracted liquid 13 is collected by the liquid collection portion 63a (or 63b) (FIG. 10B and FIG. 10C).

Alternatively, a liquid film formation apparatus 70 may be used. In the apparatus 70, gas is blown to the liquid 13 from gas spray portion 72a (72b) to change the direction of the liquid 13 to be supplied dropwise and the liquid 13 is collected by the liquid collection portion 63a (63b), as shown in FIGS. 11A, 11B, 11C. FIG. 11A is a cross-sectional view of the film formation apparatus in the case where the supply of the liquid 13 is not shut out. FIG. 11B is a cross-sectional view of the film formation apparatus in the case where the supply of the liquid 13 is shut out by spraying a gas from the gas spray portion 72a. FIG. 11C is a cross-sectional view of the film formation apparatus in the case where the supply of the liquid 13 is shut out by spraying a gas from the gas spray portion 72b.

Note that when the direction of the liquid 13 to be supplied dropwise is changed by blowing a gas, it is desirable that no obstacle be present in the gas spray direction. In the case where two gas spray portions 72a, 72b are provided and used respectively in the cases of the forward movement and the backward movement of the nozzle, it is desirable that the gas spray portions 72a, 72b be set at different levels in height.

Figure 12:
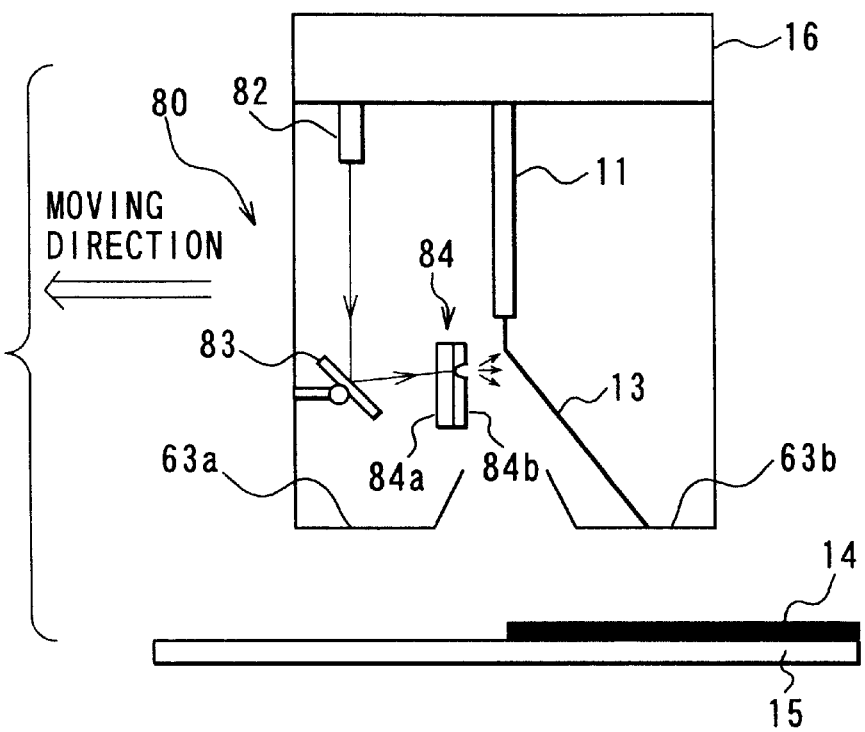
FIG. 12 is a cross-sectional view showing a structure of a liquid supply unit having a gas flowing portion using a gas generating material and a liquid collection portion.

As another method for shutting out the liquid supply by changing the direction of the liquid to be supplied dropwise by gas spray, a liquid film formation apparatus as shown in FIG. 12 may be used. In this method, light is exposed to a gas generating material to induce a reaction and the gas generated from the reaction is blown out to the liquid output from the nozzle. In this manner, the direction of the liquid supplied dropwise is changed to shut out the supply of the liquid to the substrate.

As shown in FIG. 12, a substrate 15 is mounted on a holder (not shown) horizontally. On the right above the substrate 15 are arranged a liquid supply unit 80 for forming a liquid film selectively on the substrate 15 and a unit moving portion 16 for moving the liquid supply unit 80. The liquid supply unit 80 has a liquid supply nozzle 11, a light emitting unit (a light source portion 82, a light reflecting portion 83, a gas blow out portion 84, liquid collection portions 63a, 63b.

The liquid supply nozzle 11 outputs the liquid 13 to the substrate 15. The light source portion 82 emits light for inducing the reaction of the gas generating material provided in the gas blow out portion 84. The light reflecting portion 83 reflects the light emitted from the light source portion 82. The light reflecting portion 83 thus controls the direction of the light and guides the light to the gas blow out portion 84. The gas blow out portion 84, for example, consists of a quartz substrate 84a and a gas generating material 84b mounted on the upper surface of the quartz substrate 84a. As the gas generating material 84b, for example, nitrocellulose is used. The gas generating material 84b mounted on the gas blow-out portion 84 generates gas through the reaction induced upon the receipt of the light emitted from the light emitting portion 82. The gas changes the direction of the liquid 13 to be supplied dropwise from the liquid supply nozzle 11. The liquid 13 changed in supply direction is collected by the liquid collection portion 63b.

As the light emitting unit, the light source portion 82 may be used alone. As the gas blow out portion 84, a rotation disk form and a tape form may be used other than the aforementioned form. As the quartz substrate 84a, any material other than quartz is used as long as it absorbs light from the light emitting portion 82 in a low amount. For example, cellophane may be used.

In the liquid supply unit 80, when the liquid is supplied continuously to the substrate 15, the following operation is performed. First, the liquid 13 is output from the liquid supply nozzle 11 to the substrate 15. While the output is continued, the liquid supply nozzle 11 is moved by the unit moving portion 16. Since the liquid 13 is thus supplied to the substrate 15 in a constant amount, a liquid film 14 is formed.

On the other hand, when the supply of the liquid 13 to the substrate 15 is shut out, the following operation is performed. Note that FIG. 12 shows the case where the liquid supply nozzle 11 moves to the left hand side of the paper. First, light is emitted from the light emitting portion 82. The direction of the light is controlled by the light reflecting portion 83 and irradiated to the gas generating material 84b of the gas blow out portion 84. In the gas blow out portion 84, the reaction of the light-exposed gas generating material 84b is initiated to generate a gas. The gas generated by the gas blow-out portion 84 is blown out to the liquid 13 output from the liquid supply nozzle 11. In this manner, the liquid 13 is changed in supply direction and collected by the liquid collection portion 63b. As a result, the supply of the liquid 13 from the liquid supply nozzle 11 to the substrate 15 is shut out. In this case, if the gas blow out portion is arranged in an opposite direction with respect to the nozzle 11, the liquid 13 may be collected by the liquid collection portion 63a.

Figure 13:
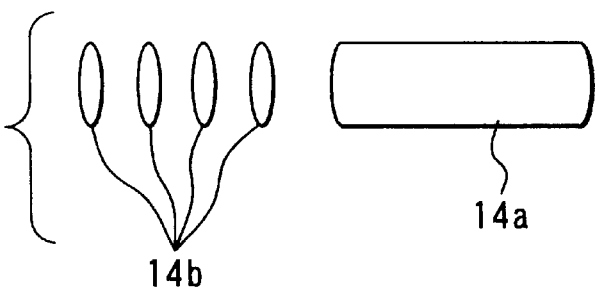
FIG. 13 is a top-down view showing a liquid film pattern immediately after a liquid is supplied onto the substrate by the liquid supply unit.

FIG. 13 is a top view of a liquid pattern formed immediately after the liquid is output onto the substrate 15 in the liquid film formation apparatus. The liquid pattern 14a shown in FIG. 13 is a coating portion formed by continuously supplying the liquid 13. Furthermore, the discrete-from liquid pattern 14b is a coating portion obtained by alternating no liquid supply (space) at the time the gas is generated at the gas blow out portion 84 and the liquid supply (pattern 14b) when the gas is not generated.

The liquid pattern 14a is desirably coated on the region having patterns with low density on the substrate, whereas the liquid pattern 14b is desirably coated on the region having patterns with high density on the substrate. If the coating is made in this manner, it is possible to form the liquid film 14 having a flat surface both on projections and depressions regardless of projections and depressions ascribed to the patterns formed on the substrate.

Figure 14:
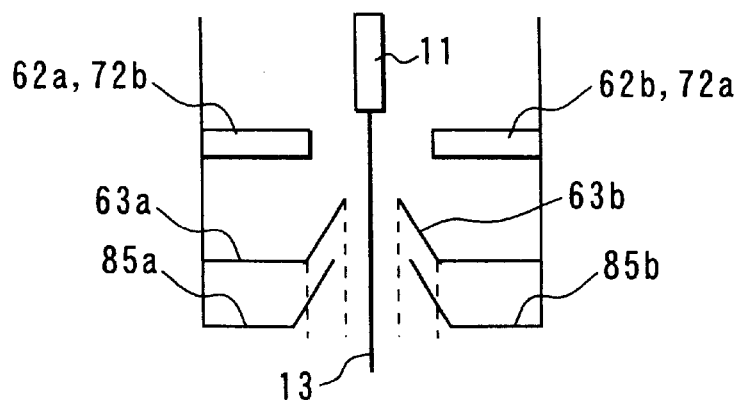
FIG. 14 is a cross-sectional view showing a structure of the liquid supply unit having a drip prevention portion.

Furthermore, in the case there the liquid is collected by the liquid collection portions 63a, 63b, the liquid drips sometimes fall from the edges of the liquid collection portions 63a, 63b to attach onto the substrate 15. To prevent this, drip guards 85a, 85b are provided below the liquid collection portions 63a, 63b, respectively, as shown in FIG. 14. In this manner, the liquid spilled out from the edge of the liquid collection portions 63a, 63b is collected by the drip guards 85a, 85b. Note that the edges of the drip guards 85a, 85b are arranged at positions outside the liquid collection portions 63a, 63b. The drip guards 85a, 85b are also adapted to FIGS. 9A, 9B, 10A, 10B and 10C, 11A–11C, 12, 20A, 20B types' unit.

In the aforementioned liquid supply unit, when the liquid supply is shut out, the supply direction of the liquid is changed toward the backward side of the moving direction, however, the supply direction may be changed to the forward side of the moving direction. However, when the nozzle is moved at a high speed, the liquid supplied drowse flows backward. Therefore, if the liquid is supplied in the backward to the moving direction, it is easier to capture the liquid at the rearward from the nozzle.

Figure 15:
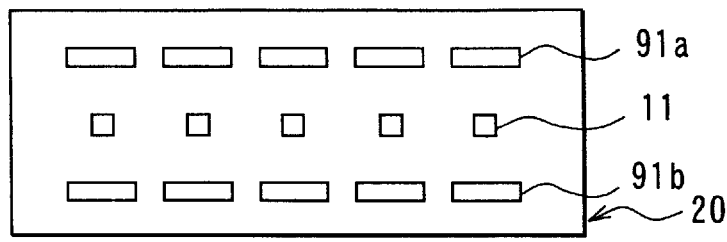
FIG. 15 shows a layout showing a first construction of the multiple liquid supply nozzle and liquid shut-out portion.

Accordingly, when the nozzle is moved in a high speed, it is desirable that liquid shut-out portions 91a, 91b be arranged for each of liquid supply nozzles 11 in the nozzle moving direction (forward and backward) as shown in the layout of the liquid supply unit of FIG. 15 and they be selectively used depending upon the moving direction. Note that the liquid shut-out portions 91a, 91b are the designation for collectively referring to the liquid suction portions 12a, 12b, the liquid suction portions 62a, 62b, liquid collection portions 63a, 63b, the gas spray portions 72a, 72b, liquid collection portions 63a, 63b, and the gas blow-out portion 84, liquid collection portion 63b. On the other hand, when the nozzle 11 moves at a low speed, the liquid may be collected either at the forward or at the rearward. In this case, a single liquid shut-out portion and a single liquid collection portion are provided, so that the liquid may be collected by the same liquid collection portion both in the forward direction and the backward direction.

Now, we will explain the case where a single liquid shut-out portion is provided per nozzle with reference to the layouts of the liquid supply unit shown in FIGS. 16, 17, 18 and 19. The like reference numerals are used in FIGS. 16, 17, 18 and 19 to designate the like structural elements in FIG. 15 and any further explanation is omitted.

Figure 16:
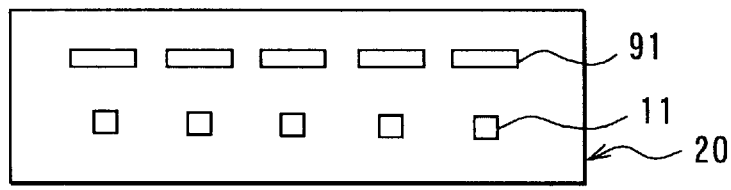
FIG. 16 shows a layout showing a second construction of the multiple liquid supply nozzle and liquid shut-out portion.

The liquid supply unit shown n FIG. 16 is constructed by arranging the liquid shut-out portion 91 at one of the moving directions of the liquid supply nozzle 11. When the liquid supply unit of this type is used, the liquid may be supplied to the substrate only in the forward direction or in the backward direction.

Figure 17:
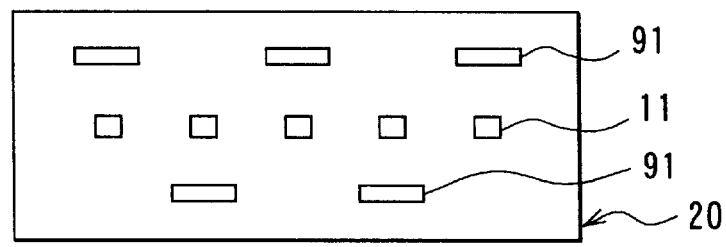
FIG. 17 shows a layout showing a third construction of the multiple liquid supply nozzle and liquid shut-out portion.

In the liquid supply unit shown in FIG. 17, the liquid shut-out portion 91 is arranged at one of the moving directions of the liquid supply nozzle 11. The liquid supply unit of this type is effective in the case where the liquid shut-out portion 91 has a function of shutting out the liquid supply by spraying a gas. In the liquid supply unit, since the liquid shut-out portions 91 are arranged alternately, the mutual interference of the gases sprayed out can be prevented.

Figure 18:
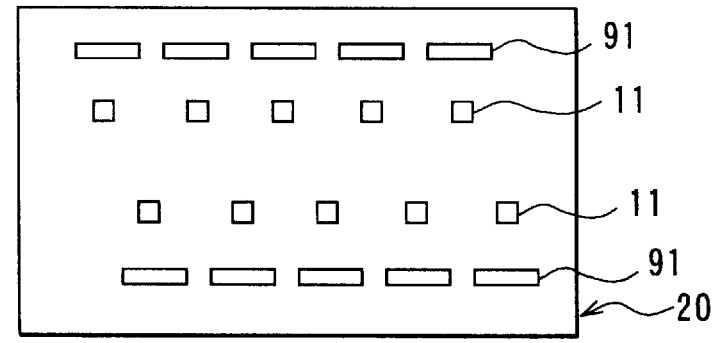
FIG. 18 shows a layout showing a fourth construction of the multiple liquid supply nozzle and liquid shut-out portion.
Figure 19:
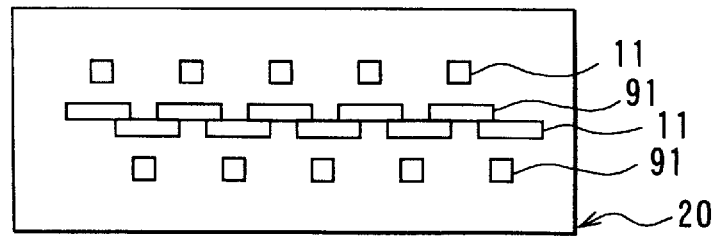
FIG. 19 shows a layout showing a fifth construction of the multiple liquid supply nozzle and liquid shut-out portion.

The liquid supply units shown in FIGS. 18, 19 are another type units, in which adjacent nozzles 11 and liquid shut-out portions 91 are appropriately arranged at a shorter distance. Thus the liquid flows output from the adjacent nozzles are narrowed. In the liquid supply unit shown in FIG. 18, the liquid shut-out portions 91 facing the corresponding liquid supply nozzles 11, are arranged in a manner that they sandwich the liquid supply nozzles 11 aligned in two rows so as not to overlap each other. The liquid supply unit shown in FIG. 19, the liquid supply nozzles 11 facing the corresponding the liquid shut-out portions 91, are arranged in a manner that they sandwich the liquid shut out portions 91 arranged in two rows so as not to overlap each other.

Figure 20A:
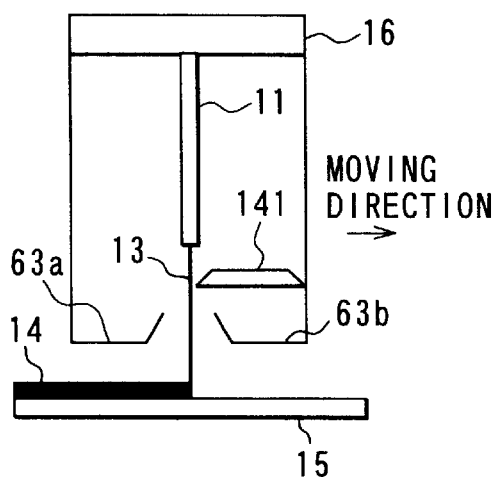
FIGS. 20A and 20B are cross-sectional views showing a liquid supply unit using a shutter as the liquid shut-out portion.
Figure 20B:
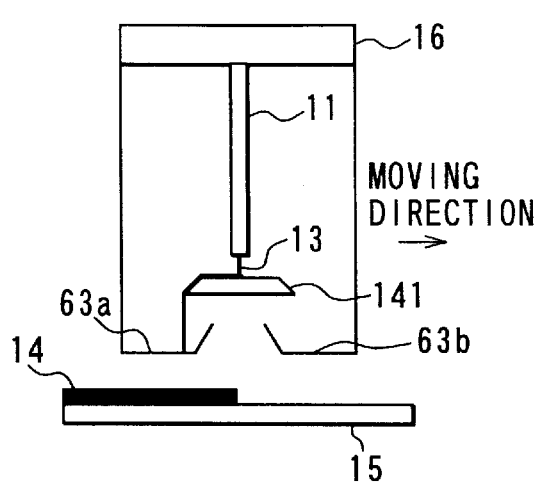

In the meantime, as shown in FIGS. 20A, 20B, the liquid 13 may be shut out by a shutter 141. The case where the liquid 13 is supplied to the substrate 15 is shown in FIG. 20A. The case where the supply of the liquid 13 to the substrate 15 is shut out is shown in FIG. 20B. In the liquid supply unit, the shutter 141 having a trapezoidal cross section is used. When the supply of the liquid 13 is shut out, the shutter 141 is inserted into the line through which the liquid 13 output from the nozzle 11 passes, from the upstream of the moving direction. Any shape of the shutter 141 may be inserted in any direction as long as the liquid 13 is not scattered on the substrate 15 by the insertion and the liquid 13 does not drip down from the back of the shutter 141.

When the nozzle is moved at a high speed, the liquid flows backward in the moving direction. Therefore, the shutter is inserted in the same direction as the flow direction of the liquid. When the shutter is inserted in the opposite direction, the liquid is scattered to smear the surface of the film formation substrate.

[Second Embodiment]

In this embodiment, we will explain the method in which a film is previously formed by using a solvent which rejects a solution of an antireflection material, on a non-film-formation region (alignment mark, non chip formation region in the outer periphery of the substrate) and thereafter, a film of the antireflection material is formed.

Figure 21A:
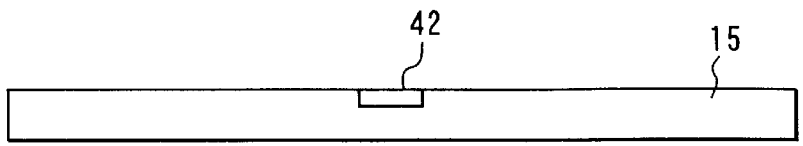
FIGS. 21A, 21B, 21C and 21D are cross-sectional views of an apparatus and a substrate in a step of selectively forming a liquid film according a second embodiment of the present invention.

FIGS. 21A, 21B, 21C and 21D are cross-sectional views of an apparatus and substrate showing the steps of selectively forming a liquid film according to a second embodiment of the present invention. First, as shown in FIG. 21A, a substrate 15 is prepared having an alignment mark 42 formed on the surface thereof and horizontally held on the holder (not shown).

Figure 21B:
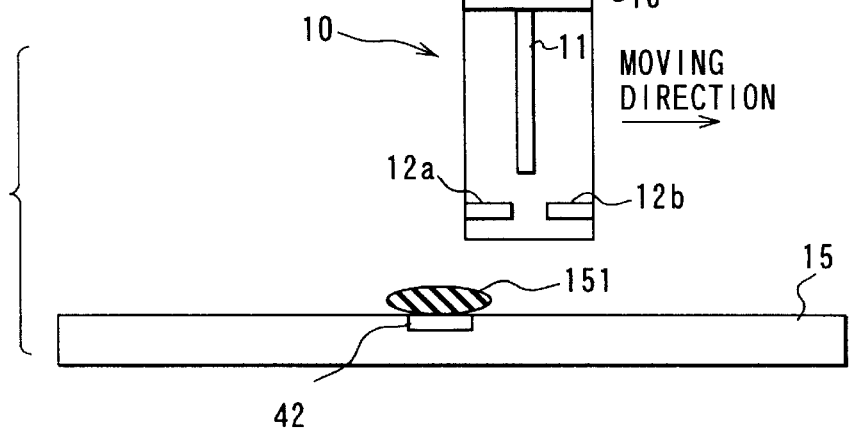

Subsequently, as shown in FIG. 21B, a liquid supply unit 10 (shown in FIGS. 5A, 5B and 5C) having a single liquid supply nozzle 11 is moved reciprocally in the line (row) direction and simultaneously in the row (line) direction with respect to the substrate 15. In this manner, solvent, EEP 151 is supplied drowse selectively in a non antireflection film formation region, in other words, in a region containing the alignment mark 42. The shape of the port of the nozzle 11 used herein is a rectangle of 10 $\mu$m×40 $\mu$m (a long side of the rectangle is arranged in perpendicular to the moving direction of the nozzle).

Figure 21C:
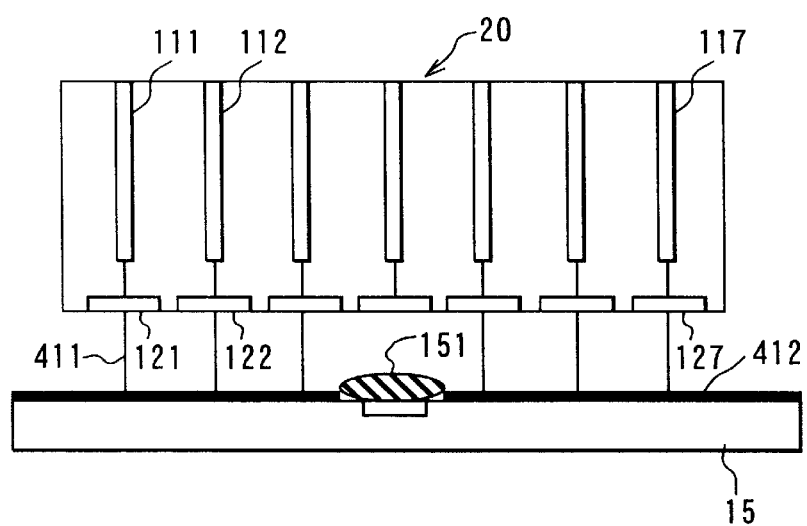

Subsequently, a film of an antireflection solution 411 is selectively formed by using the liquid film formation apparatus 20 shown in FIG. 6 having a plurality of liquid supply nozzles 111–117 and the liquid suction portions 121–127. At this time, as shown in FIG. 21C, supply of the antireflection solution 411 is shut out to the region containing the alignment mark 42 of the substrate 15. In practice, a solid matter of the antireflection material contained in the solvent was set at 0.5%. The moving speed of the liquid supply unit was set at 100 mm/sec. As a result, the antireflection liquid film 412 was formed at a film thickness of 0.055 $\mu$m.

Figure 21D:
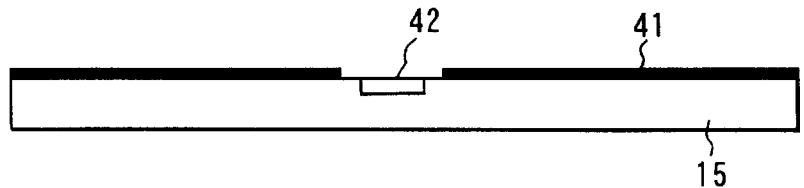

After the film is selectively formed, the baking is performed. As a result, solvent EEP 151 is vaporized and disappears as shown in FIG. 21D. In addition, the solvent contained in the antireflection liquid film 412 is vaporized to thereby form an antireflection film 41 accurately in a region except the alignment mark region.

Subsequently, the EEP solvent was previously coated selectively on a non film formation region except the alignment mark region and the region outside the chip formation region in the same manner as in the case where the antireflection film 41 was formed. Thereafter, a solution containing a resist material dissolved in solvent EL was coated on the film-formation region of the substrate 15. The solid matter of the resist solution was 1.5%. The liquid supply unit was moved at a moving speed of 50 mm/sec. As a result, a resist film was formed in a film thickness of 0.3 $\mu$m.

In this embodiment, since the antireflection film and the resist film were not formed on the alignment mark, accuracy in the alignment at the time of light exposure was dramatically improved. Furthermore, the improvement in alignment accuracy influences device designing, difference in electric properties depending upon the devices was reduced and the chip area was further reduced.

Figure 22A:
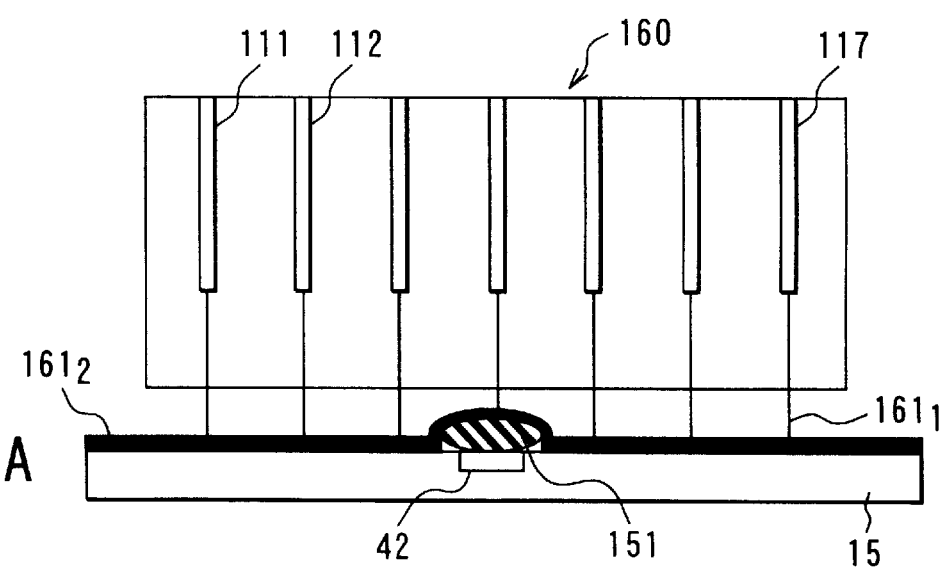
FIGS. 22A and 22B are cross-sectional views of an apparatus and a substrate in a step of selectively forming a liquid film using a liquid supply unit having no liquid shut-out mechanism.
Figure 22B:
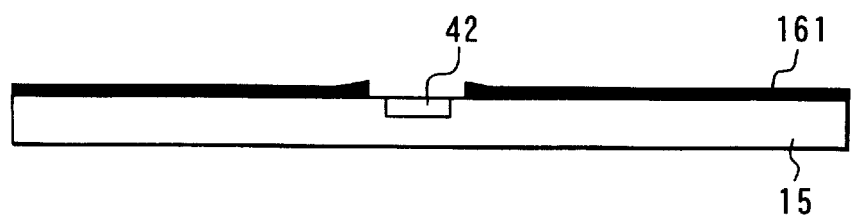

Films may be formed from diluted solutions of the antireflection material and the resist material in the following steps. After the step shown in FIG. 21B, a resist solution 1611 is supplied drowse and uniformly on the substrate 15 by using a liquid film formation apparatus 160 having no liquid shut-out mechanism, without supplying the antireflection solution or the resist solution selectively, as shown in FIG. 22A. In this manner, a resist liquid solution 1612 is formed.

Of the resist solution 1611 supplied drowse and uniformly on the substrate 15, the resist solution 1611 supplied drowse on the EEP 151 slides down along the surface of the EEP 151 to the periphery of the EEP 151. Thus, after the resist liquid film 1612 using an EL solvent was coated and subjected to baking, EEP 151 is vaporized and disappeared, and simultaneously, the EL solvent contained in the resist liquid film 1612 was vaporized. As described in the foregoing, the resist film 161 was formed selectively in the region except on the alignment mark 42 of the substrate 15.

The resist film 161 is thicker near the non film formation region of the alignment mark 42. However, the region was not required to form a pattern contributing to the device, the processing accuracy was not affected.

[Third Embodiment]

In this embodiment, we will explain the case where the present invention is applied to a wiring pattern. A substrate of 3 mm thick made of AlNx is horizontally placed on a holder. A liquid film formation apparatus is set above the substrate.

In this embodiment, a wiring pattern is formed by using the liquid film formation apparatus having a plurality of liquid supply units (shown in FIGS. 10A–10C) arranged in line. The liquid supply units are arranged in the direction perpendicular to the moving direction of the apparatus. Since each of liquid suction portions of the liquid supply units is controlled independently, the liquid can be coated selectively on a film formation region or a non film-formation region.

Note that the liquid supply nozzles of the liquid supply unit used were arranged at intervals of 100 $\mu$m. The shape of the nozzle port was a square of 40 $\mu$m×40 $\mu$m. While the apparatus was reciprocally moved in a line (row) direction and simultaneously in a row (line) direction with respect to the substrate. In this manner, a liquid film was formed.

The apparatus was moved above the substrate along the illustration of wiring to form the film. The apparatus was moved at a constant speed when it moved along a line or a curve. Curvature was given to a point of return of the pattern, so that the moving speed of the nozzle was not changed.

A film was formed by controlling the amount of a silver paste (serving as a wiring material) to be output from each of liquid supply nozzle per unit time. The liquid was sucked by the liquid suction portion in a non-wiring formation region on the basis of wiring design data. In this way, the silver paste was prevented from being supplied to the substrate. After all wiring patterns were formed, a solvent was vaporized by subjecting the substrate to baking at a temperature of 400° C. to fix or fit the wiring pattern.

Using the wiring pattern formed in this embodiment as a heater (soaking plate: AlNx, a heater material: silver) by supplying electric power thereto, a plate-form substrate was heated to 150° C. As a result, the temperature uniformity was ±0.2° C. When a wiring pattern formed by silk-screen printing conventionally used (coating spots were present in a printing direction) was used as a heater by supplying electric power, the temperature differs within ±1° C. since difference in resistance was large. Compared to the conventional heater, the uniformity in temperature was dramatically improved in this embodiment as mentioned above. Furthermore, when the wiring pattern formed by using a conventionally-employed liquid supply nozzle, which was characterized by controlling the output operation within the nozzle, was used as a heater by supplying power thereto, temperature differed within ±0.6° C. since a resistance value was varied by influence of pulsation flow. Compared to this, the uniformity of temperature was dramatically improved in the wiring pattern of this embodiment.

[Fourth Embodiment]

In this embodiment, we will explain the case where the present invention is applied to formation of a wring pattern.

A substrate of 3 mm in thick made of AlNx is placed horizontally on a holder. A liquid supply nozzle is arranged above the substrate.

In this embodiment, a wiring pattern is formed by using the liquid film formation apparatus having a plurality of liquid supply units (as shown in FIGS. 20A, 20B) arranged linearly. The liquid supply units are arranged in a direction perpendicular to the moving direction of the apparatus. Each of the shutter of the liquid supply units is controlled independently to thereby coat a liquid selectively to a film formation region or a non film formation region. The shape of the port of the liquid supply nozzle used herein was a square of 40 μm×40 μm.

Using such a film formation apparatus, a wiring pattern was formed in the same manner as in the third embodiment. The apparatus was moved on the basis of wiring design data. A shutter was released to supply a liquid to the substrate at an initial point of the wiring and inserted to terminate the supply at an end point thereof. Likewise, the shutter was inserted in the region in which no wiring is formed, so that a silver paste was prevented from being supplied to the substrate. After all wiring patterns were formed, the substrate was baked at 400° C. to fix and fit the wiring patterns.

The wiring pattern thus formed in this embodiment was used as a heater (soaking plate=AlNx, heater material= silver) by supplying power thereto, the plate-form substrate was heated to 150° C. As a result, the uniformity in temperature was ±0.2° C. The wiring pattern formed by a conventionally used printing using silk screen (coating spots were present in the printing direction) was used as a heater by supplying power thereto. The difference in temperature was within ±1° C. since resistance greatly differed. Compared to the conventional case, in this embodiment, uniformity in temperature was dramatically improved as described. Furthermore, the wiring pattern formed by using a conventional liquid supply nozzle in which output is controlled within the nozzle, was used as a heater by supplying power thereto. As a result, difference in temperature was ±0.6° C. since the resistance value differed by the influence of a pulsation flow. Hence, compared to this case, the uniformity in temperature was drastically improved in this embodiment.

[Fifth Embodiment]

This embodiment relates to an apparatus having a liquid supply nozzle and a liquid shut-out portion which are integrated as a one body. We will explain how to overcome problems produced when the nozzle moving speed is high in the case where a liquid to be supplied from a nozzle vertically to a substrate is shut out by the shut-out portion while the integrated body is moved along the substrate.

Figure 23:
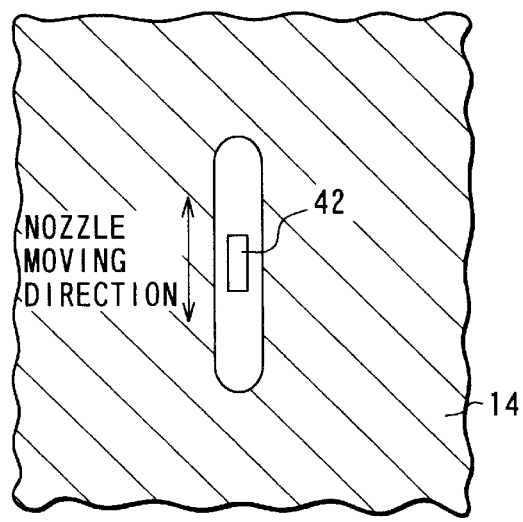
FIG. 23 is a top-down view of a substrate showing a state of a film formed while a liquid is not supplied to a film formation region.

In the integrated body, when the nozzle moves faster than the movement of the liquid shut-out portion, a problematic phenomenon may sometimes come up in which no liquid is supplied even if the nozzle reaches outside the non film formation region, in other words, even if the nozzle reaches the film formation region. The film formation state of this case is shown in FIG. 23.

Figures 24A, 24B, 24C:
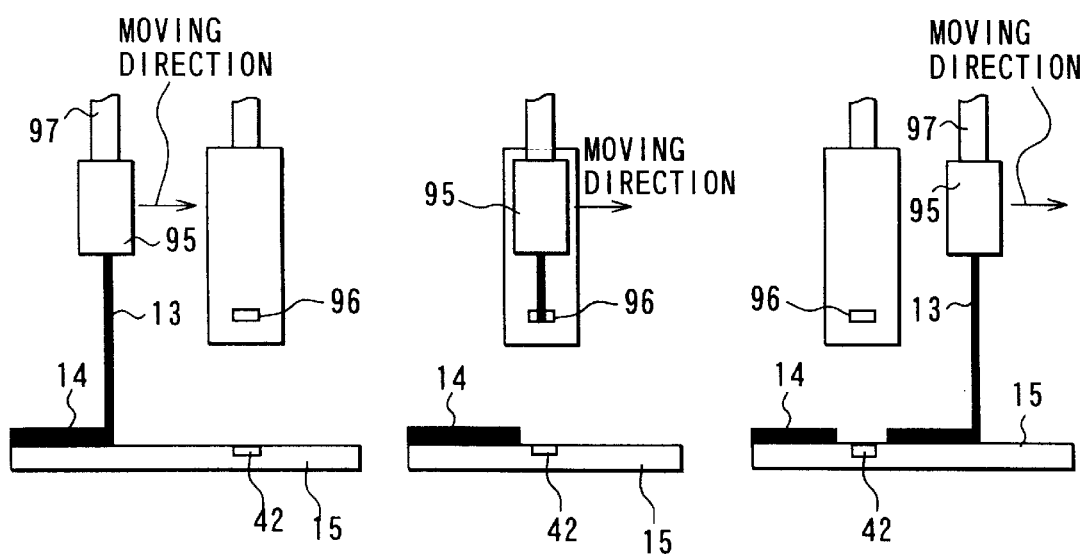

FIG. 24A shows a cross-sectional view showing a structure of a liquid film formation apparatus according to the fifth embodiment of the present invention. Furthermore, FIGS. 24A–24C show cross sectional views showing selective film formation steps of a liquid film 14 using the aforementioned liquid film formation apparatus.

The liquid film formation apparatus has a liquid supply nozzle 95 and a liquid shut-out portion 96. The liquid supply nozzle 95 outputs a liquid 13 to a substrate 15. The liquid shut-out portion 96 shuts out the liquid 13 output from the liquid supply nozzle 95 from being supplied to the substrate 15. The liquid supply nozzle 95 and the liquid shut out portion 96 are constructed independently movable. Furthermore, the liquid shut-out portion 96 is arranged at a level (height) between a nozzle port of the liquid supply nozzle 95 and the substrate 15.

In the liquid film formation apparatus thus constructed, a liquid is coated as follows.

As shown in FIG. 24A, a substrate 15 having an alignment mark on the surface is horizontally placed on a holder (not shown). The liquid supply nozzle 95 for supplying a liquid dropwise to the substrate 15 is arranged right above the substrate. The liquid supply nozzle 95 is equipped with a nozzle moving portion 97.

When the liquid 13 is supplied to the substrate 15, the nozzle 95 is moved by the nozzle moving portion 97, and simultaneously the liquid 13 is supplied from the nozzle 95 to a film formation region on the substrate 15. In this case, before the liquid supply nozzle 95 is moved, the liquid shut-out portion 96 is moved and arranged right above the alignment mark 42 (non film formation region).

Then, as shown in FIG. 24B, the liquid supply nozzle 95 moves while the liquid 13 is output, and reaches right above the alignment mark 42 (non film formation region). Then, the liquid shut-out portion 96 shuts out the liquid 13 output from the nozzle 95 from being supplied dropwise to the substrate 15. In this way, the supply of the liquid 13 to the substrate 15 is shut out. Furthermore, when the liquid supply nozzle 95 passes over a position right above the alignment mark 42, the shut-out of the liquid 13 by the liquid shut-out portion 96 is released as shown in FIG. 24C. In this manner, the supply of the liquid 13 onto the substrate 15 is initiated.

Figure 25:
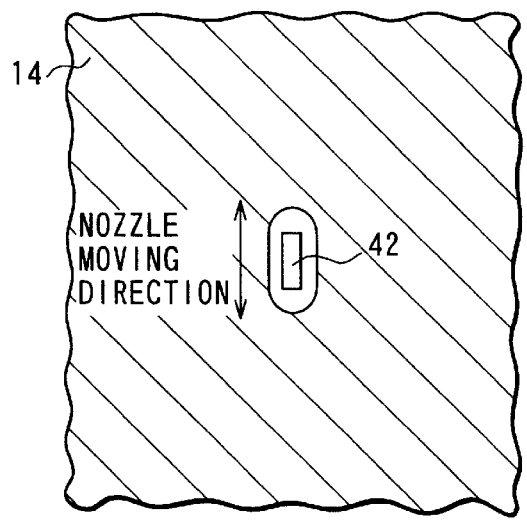
FIG. 25 is a top view of a substrate showing a state of a film formed by the liquid film formation apparatus.

FIG. 25 is a top view of a state of a liquid film formed in this embodiment. As shown in FIG. 25, a liquid film 14 is securely formed in the film formation region outside the non film formation region having the alignment mark 42 formed thereon. Hence, the problem of no liquid (13) supply to the film formation region can be overcome.

In a conventionally-used apparatus having the liquid supply nozzle and the liquid shut-out portion integrated as one body, when a moving speed of the nozzle is faster than the movement of the shut-out mechanism of the liquid shut out portion, a problematic phenomenon comes up in which a liquid is not supplied to the region except the non film formation region. In this embodiment, the liquid shut-out portion is previously moved to the non film formation region and the shut-out mechanism is operated before the liquid supply nozzle passes over there. Then, the liquid supply nozzle is operated so as to move across the liquid shut-out portion. In this way, the non film formation region can be formed only in a desired region. As the liquid shut-out portion, a physical method of shutting out a liquid may be employed. That is, the liquid may be shut-out by either sucking or gas release.

Note that the present invention is not limited to the aforementioned embodiments and may be modified in various ways within the gist of the present invention.

As explained in the foregoing, according to first to fifth embodiments, it is possible to prevent generation of particles by maintaining an amount of the liquid output from the nozzle at a constant level and shutting out the liquid supply to the substrate by the liquid shut-out portion arranged below the nozzle portion. Furthermore, it is possible to supply the liquid uniformly on the substrate without generating a pulsation flow in the liquid immediately before the shut-out of the liquid supply and at the time the liquid supply is reinitiated after the shut-out of the liquid supply.

If the first and fifth embodiments of the present invention are used, it is possible to provide a film formation method and apparatus capable of suppressing contamination of the liquid film with impurities when the liquid film is selectively formed on the substrate and simultaneously forming the liquid film with a uniform thickness.

[Sixth Embodiment]

In this embodiment, we will explain a method of coating an SOG solution on an uneven substrate to make the surface flat.

Figure 26:
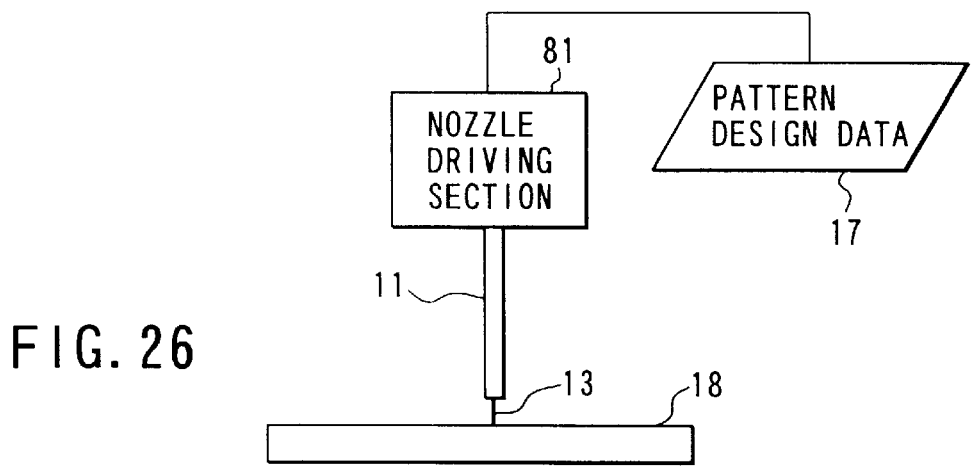
FIG. 26 is a diagram showing a structure of a coating apparatus according to a sixth embodiment of the present invention.

FIG. 26 is a diagram showing a schematic structure of a coating apparatus according to the sixth embodiment of the present invention. The coating apparatus has a liquid supply nozzle 11, a nozzle driving section 81, and pattern design data 17. The liquid supply nozzle 11 supplies a liquid 13 dropwise to a substrate 18. The nozzle driving section 81 moves a liquid supply nozzle 11 on the basis of the pattern design data 17.

Figure 27A:
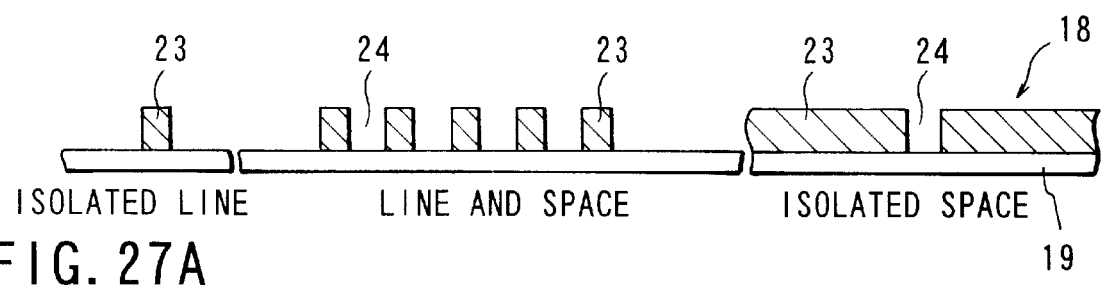
FIGS. 27A, 27B and 27C are cross-sectional views of a substrate showing a step of forming a film on a substrate using the coating apparatus.
Figure 27B:
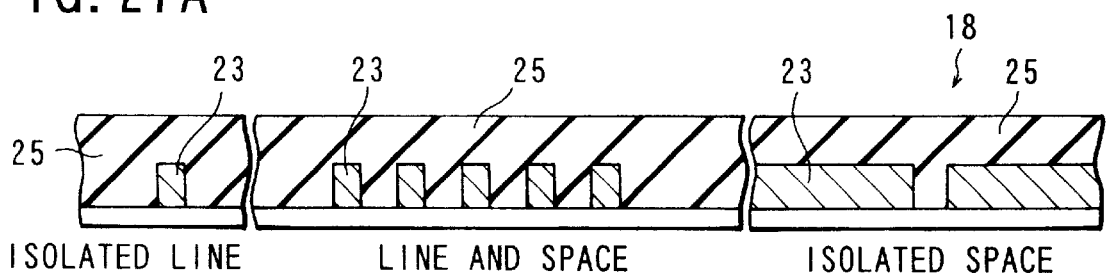
Figure 27C:
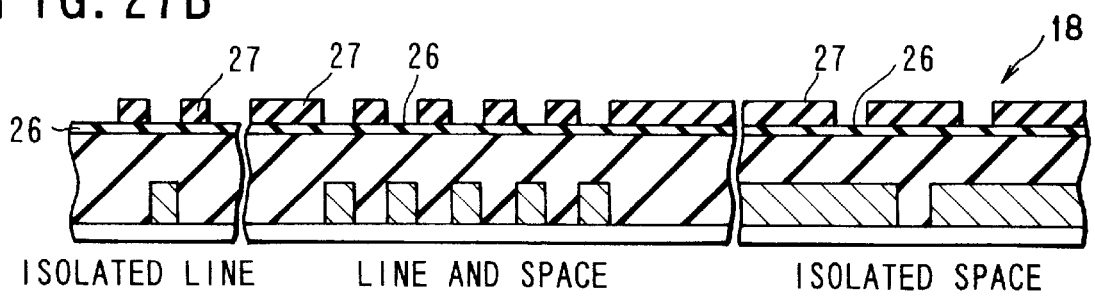

With reference to FIGS. 27A, 27B and 27C, we will explain steps of forming an insulating film on the substrate 18 using the coating apparatus. In this embodiment, SOG is employed as a material for the insulating film. SOG is used in the form of an SOG solution by dissolving it with thinner so as to contain 20% of a solid matter.

As shown in FIG. 27, the substrate 18 is formed of an unprocessed substrate 19 and a structure 23 such as wiring formed on the substrate 19. Thus, a depressed portion 24 is present on the substrate 19. The depth of the depressed portion (space) 24 formed in the substrate 18 is about 0.25 $\mu$m. In the substrate 18, there are a isolate line region, a line & space region, and an isolate space region.

Figure 28:
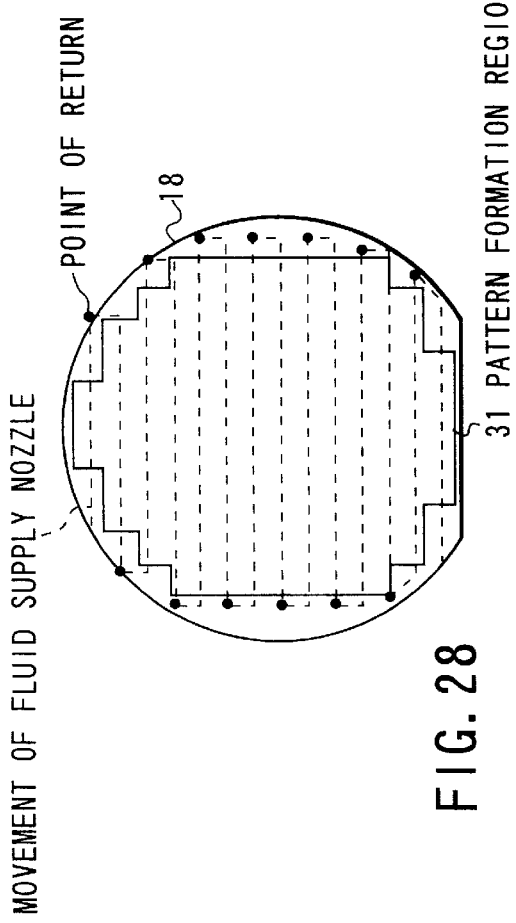
FIG. 28 is an illustration showing how to move a liquid supply nozzle above a substrate.

To form an SOG film on the substrate 18 having the structure as shown in FIG. 27, the substrate 18 is fixed and the SOG solution is continuously output from a liquid supply nozzle (aperture: 50 $\mu$m) 11 to the unmoved substrate 18. Then, the liquid supply nozzle 11 is moved reciprocally in a row direction as shown in FIG. 28. Every time the liquid supply nozzle 11 reaches at a point of return present outside the pattern formation region 31, it is moved in the line direction at a predetermined pitch. The pitch in the line direction is previously set at a value smaller than the width of liquid spread in the line direction on the substrate 18.

Figure 29:
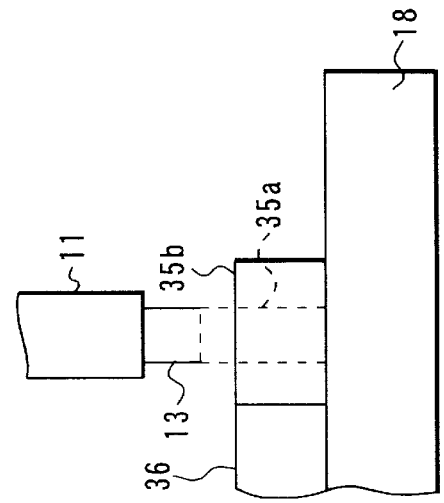
FIG. 29 is a cross-sectional view of a liquid output portion when a liquid is output from a liquid supply nozzle.

The cross sectional view of the output portion when the liquid 13 is output from the liquid supply nozzle 11 is shown in FIG. 29. As shown in FIG. 29, the SOG solution 35a output from the nozzle 11 onto the substrate 18 is spread thin. If the moving pitch in the line direction is set at a value smaller than the spread amount (width) of the SOG solution in the line direction, the newly spread SOG solution 35b comes in contact with the SOG solution 36 which has been already supplied on the substrate 18. Hence, all lines of the SOG solution output from the liquid supply nozzle 11 are in contact with each other. In this manner, the SOG solution can be coated over the entire pattern formation region 31.

In this embodiment, film formation conditions are determined in order to obtain an output amount attaining the SOG (SiO$_2$) film after baking in a thickness of 1 $\mu$m, under the conditions: nozzle moving speed V$_0$=100 mm/sec, moving pitch P of a nozzle at both sides during reciprocal movement=100 $\mu$m.

On the basis of the film formation conditions thus determined, the SOG solution is coated by changing a moving speed V in the row direction of the nozzle 11 depending upon the ratio of a depressed portion per unit area. Note that the moving speed is varied in units of 100 $\mu$m. The moving speed V is defined by Equation (1)

$$V=V_0/((t-d)+ds) \qquad (1)$$

where S is the ratio of the depressed portion in 100 $\mu$m$^2$ region, d is a depth of the depressed portion, and t is a thickness of a film to be formed.

Figure 30:
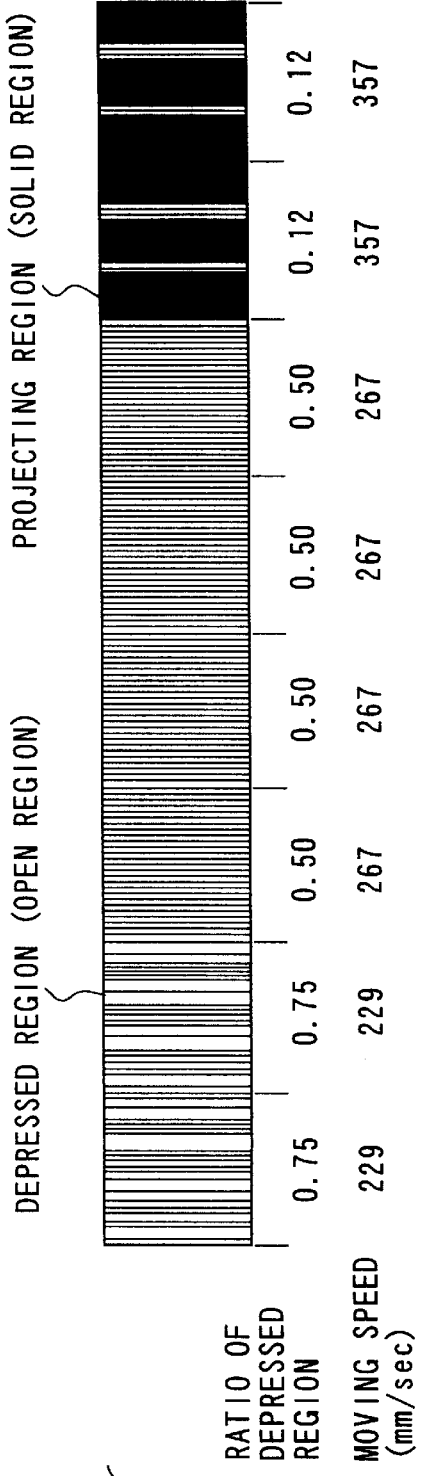
FIG. 30 is a diagram showing a moving speed of a liquid supply nozzle relative to a projection/depression pattern on the substrate.

When a substrate had a projection/depression pattern shown in FIG. 30, a nozzle moving speed was changed as follows: The moving speed was set at 229 mm/sec in the region whose ratio of depressed portion is 75%. The moving speeds for regions having depressed portion ratios of 50% and 12% were set at 267 and 357 mm/sec. During the film formation process, the SOG solution output from the liquid supply nozzle 11 spread with the passage of time and finally formed a film having a width of about 100 $\mu$m.

As a result, a flat surface of the SOG liquid film was obtained on the substrate 18 after coating of the SOG solution was completed in accordance with such a coating method. Furthermore, the surface level of the SOG liquid film, that is, the height of the SOG solution from the substrate 19 (not from a pattern such as wiring), was not varied depending upon the regions. Thereafter, the substrate 18 was shaken (moved reciprocally) in a horizontal direction by about 2 mm during vaporizing the solvent to further move the SOG solution. In this manner, the SOG solution is further flattened.

Furthermore, as shown in FIG. 27B, an SiO$_2$ film 25 was formed by vaporizing the solvent slowly. The film thickness of the SiO$_2$ film 25 formed on the pattern (projecting portion) was 0.25 μm. The film thickness of the SiO$_2$ film 25 formed in the depressed portion was 0.50 μm. The difference between the projecting portion and the depressed portion of the surface of the SiO$_2$ film was about 3 nm. It is therefore demonstrate that the SiO$_2$ film 25 having a flat surface was successfully formed on the substrate 18.

As shown in FIG. 27C, an antireflection film 26 having an antireflection effect against a DUV light (wavelength: 248 nm) was formed on the SiO$_2$ film 25 in a thickness of 50 nm by using the same apparatus as used in the SOG film formation. In this case, the antireflection film 26 had to be formed in a uniform thickness on the surface of the almost flat SiO$_2$ film 25 along with the projections and projections of the surface. The film was formed by maintaining a moving speed of the liquid supply nozzle 11 constant, controlling the ratio of a solid matter to the solvent for the antireflection film 26, and controlling the moving pitch of the nozzle to a value less than the extent of the liquid (13) spread. When the antireflection film 26 was formed, the nozzle moving speed V is controlled so as to be faster by 1% at the depressed portion and slower by 1% at the projecting portion. The control was made on the presumption that the film thickness of the depressed portion may be increased by free-flow movement of the solution after the liquid film formation. To the projecting portion, a larger amount of the solution was given in advance by the amount corresponding to a loss in film thickness, which presumably lose by the free-flow movement during the film formation process.

Subsequently, using the same method as in the case of the antireflection film 26, a resist film was formed on the antireflection film 26 in a thickness of 0.25 μm. The solid matter for the antireflection film 26 was set at 1% (viscosity: 1.5 cp) and the solid matter for the resist film was 3% (viscosity: 1.7 cp). Thereafter, DUV light exposure, PEB (post exposure bake), development were performed to obtain a resist pattern 27 having a wiring width of 0.25 μm. As described, the substrate surface was flattened with high accuracy. Thereafter, the antireflection film and the resist film were formed on the substrate depending upon minor projections and depressions. It is therefore possible to form a pattern having a wiring width controlled within 3 nm in a quite satisfactory state.

Figure 31A:
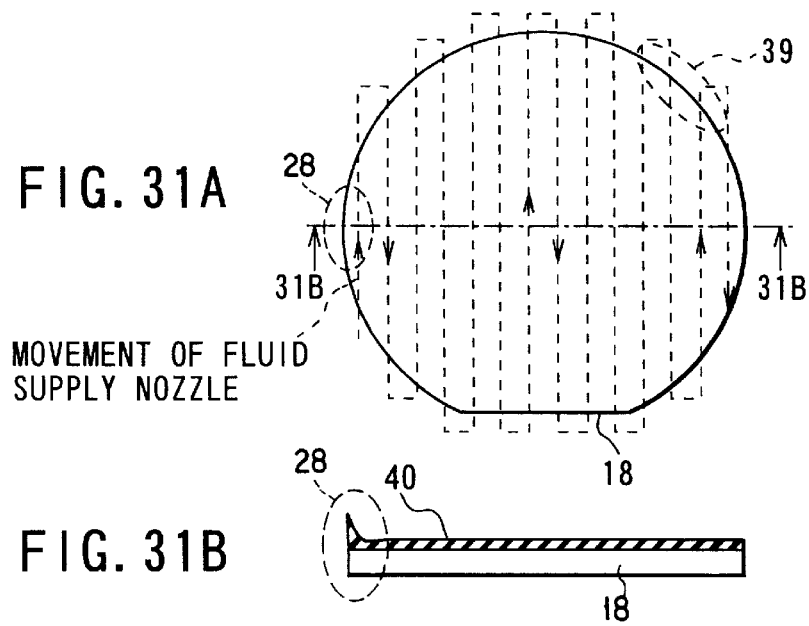
FIG. 31A is an illustration showing how to move a liquid supply nozzle above a substrate during liquid coating step.

In the aforementioned embodiment, as shown in FIG. 31A, the SOG solution was coated while the nozzle was moved from one side to the other side of the periphery of the substrate 18. However, depending upon the conditions of the SOG solution and the state of the substrate surface, the following defects may be sometimes produced if this coating method is used.

Figure 31B:
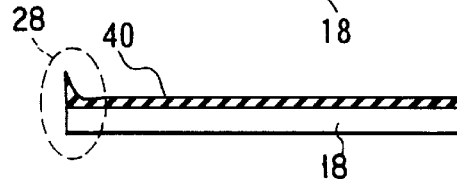
FIG. 31B is a cross-sectional view of a substrate having a defect of a liquid film coated thereon.

FIG. 31B is a cross-sectional view of the substrate shown in FIG. 31A having the defects. In the beginning region 28 where the liquid supply nozzle 11 moving on the substrate 18 terminates output of the liquid, a solvent concentration is decreased and furthermore the solvent is vaporized from the beginning region 28, with the result that aggregation takes place in the SOG solution. As a result that the SOG solution are solidified, the beginning region 28 of a film 40 is raised in an angular form (as shown in FIG. 31B) and the thickness of the film around the beginning region 28 is reduced.

Figure 32A:
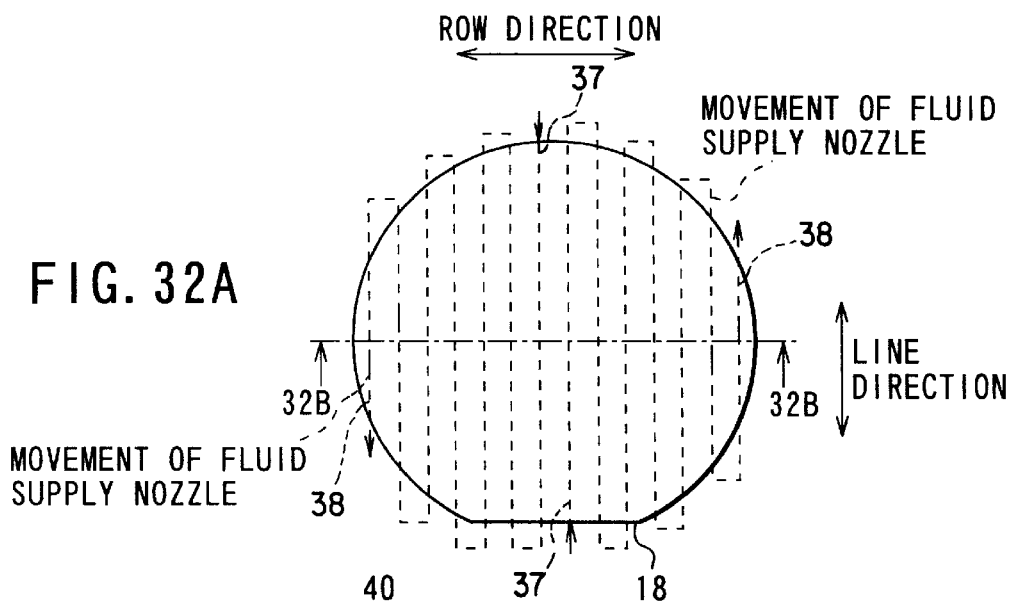
FIG. 32A is an illustration showing how to move a liquid supply nozzle above a substrate during liquid coating step in which a means is provided so as not to make the aforementioned defect.
Figure 32B:
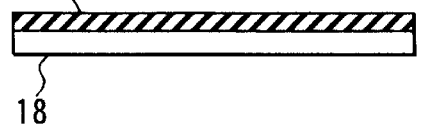
FIG. 32B is a cross-sectional view of the substrate shown in FIG. 32A.

When such a defect takes place, the SOG solution is coated while the nozzle 11 is moved both edges of the outer peripheral portion of the substrate (terminal point 38) from inward (initial points 37). To describe more specifically, the nozzle 11 is moved reciprocally in a line direction from one edge of the inner portion of the substrate 18. When the nozzle 11 reaches a point of return, it is moved in the row direction by a predetermined pitch and the coating of the SOG solution is continued until it reaches the outer peripheral portion of the substrate 18. In addition, the nozzle 11 is moved reciprocally in a line direction from the other edge of the inner portion of the substrate 18. When the nozzle reaches a point of return, it is moved in the row direction by a predetermined pitch and the coating of the SOG solution is continued until it reaches the outer peripheral portion of the substrate 18. In this case, care must be taken to avoid overlapping of coating. In this case, the aforementioned predetermined pitch is set at a value less than the extent of the liquid spread in the row direction of the substrate 18. If the coating is performed in this manner, the concentration of the solvent is not decreased in the outer peripheral portion (terminal point of the output) of the substrate. As a result, no aggregation occurs and the beginning region 28 of the film 40 is not raised in an angular form as shown in FIG. 32B.

Figure 33A:
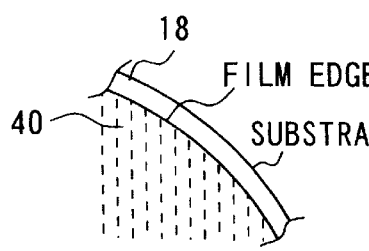
FIGS. 33A and 33B are magnified views of an outer peripheral portion of the substrate.
Figure 33B:
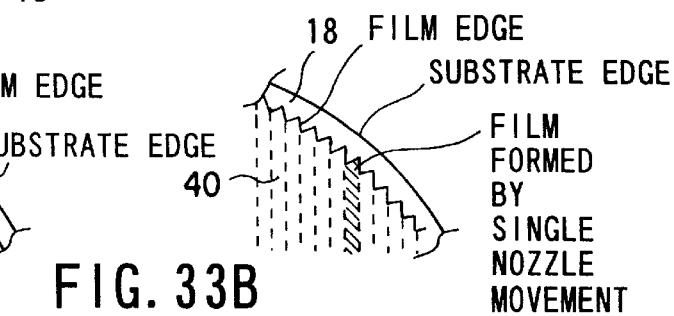

If attention is directed to the outer peripheral portion 39 of the substrate 18, the liquid is coated so as to obtain the film 40 having a smooth curved line of the outer peripheral portion, the surface tension is applied to the outer peripheral portion 39 of the substrate 18 inwardly in the same direction. As a result, aggregation takes place in the film of the outer peripheral portion, with the result that the obtained film is thick. Then, if the liquid is coated so as to obtain the film 40 having a zigzag outer peripheral portion (ria shoreline), as shown in FIG. 33B, the surface tension is dispersed. Therefore, it is possible to prevent the outer peripheral portion 39 from increasing in thickness. In the case where the zigzag line is formed as shown in FIG. 33, it is better to control the shut-out timing of the liquid by using the methods shown in FIGS. 24A, 24B and 24C. Note that FIGS. 33A, 33B are magnified views of the peripheral portion of the substrate.

A diluted SOG solution is used as the liquid in the embodiments of the present invention; however, the liquid is not limited to this. An antireflection film, a conducting film, and a resist film to be used in a lithographic process, can be formed in the same manner. When these films are formed, it is desirable to dilute raw materials with thinner. When diluted, a solid material is desirably contained in a percentage of 3 or less. Furthermore, the present invention is applicable to the case where a film is formed by using a metal paste as a wiring material. In the embodiments of the present invention, the diluted solution using thinner is used as the liquid. However, a molten solution of a raw film material may be used.

In the case where the ratio of the depressed portion does not change in the moving direction (row direction) of the nozzle but changes in the perpendicular direction to the moving direction (line direction), a film having a flat surface can be formed by changing a moving pitch while maintaining the moving speed. When needed, both the moving speed and moving pitch of the nozzle may be changed.

Figure 34:
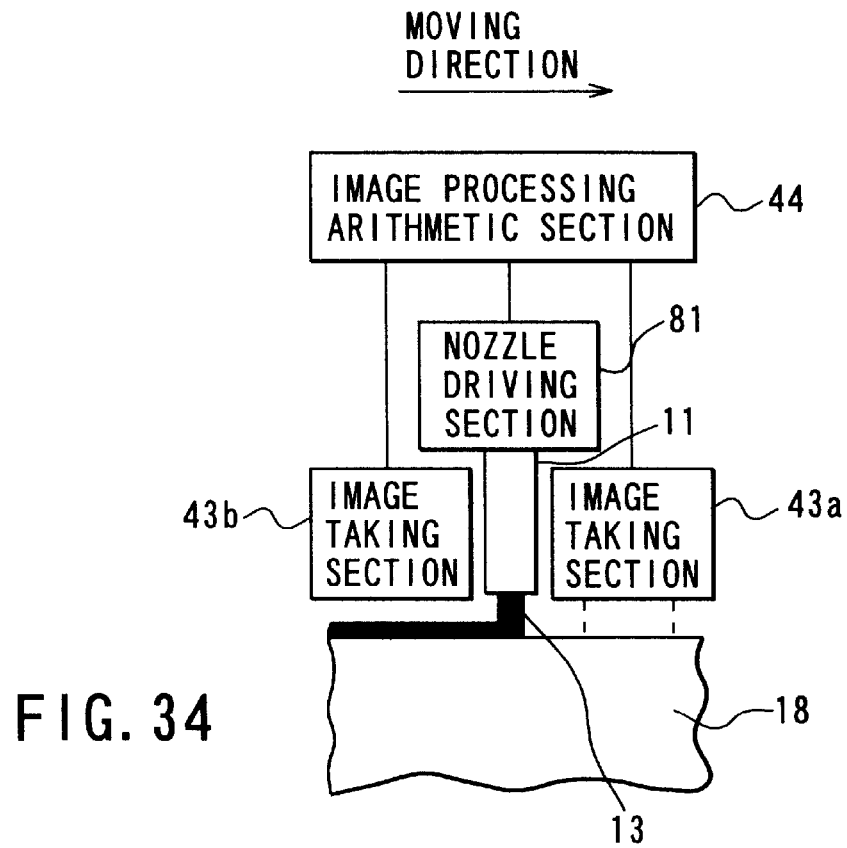
FIG. 34 is a cross-sectional view showing a structure of the coating apparatus having an image taking means.

In the embodiments, the ratio of the depressed portion on the substrate 18 is obtained on the basis of the pattern data at the time the designing. As shown in FIG. 34, an image of the surface of the substrate 18 is taken by image taking sections 43a, 43b. The ratio of the depressed portion can be obtained through arithmetic calculation by an arithmetic image processing portion 44. The image taking section 43a (43b) consists of a CCD or the like and positioned in the front of the moving direction of the liquid supply nozzle 11. Alternatively, the ratio of the depressed portion may be obtained from the image itself. Furthermore, when a micro pattern of a measurable wavelength or less is present, the pattern may be obtained in the form of contrast (light and shade) of the reflection light. The contrast value may be used as the ratio of the depressed portion. In consideration of the reciprocal movement of the liquid supply nozzle 11, it is preferred to set the image taking sections 43a, 43b both in forward and backward moving directions.

[Seventh Embodiment]

In this embodiment, a plurality of liquid supply nozzles (aperture: 50 $\mu$m) are arranged in the direction perpendicular to the nozzle moving direction. The SOG solution is coated by the liquid supply nozzles the output amount of which can be independently controlled Note that the same substrate and SOG solution as those of the sixth embodiment are used.

An output amount G0 of the SOG solution was obtained so as to attain a film thickness of 1 $\mu$m after the SOG (SiO$_2$) film was baked under the conditions: nozzle moving speed V$_0$=100 mm/sec, moving pitch P at a point of return=100 $\mu$m. As a result, the output amount G0 was 5 $\mu$l/sec.

On the basis of the film formation conditions determined, a film was formed by changing the output amount G depending upon the ratio of the depressed portion per unit area. The output amount G was controlled in units of 10 $\mu$l. The output amount G was defined by Equation (2)

$$G=G0((t-d)+dS) \qquad (2)$$

where S is the ratio of the depressed portion in a region of 100 $\mu$m$^2$, d is a depth of the depressed portion, and t is a thickness of a film to be formed.

Figure 35:
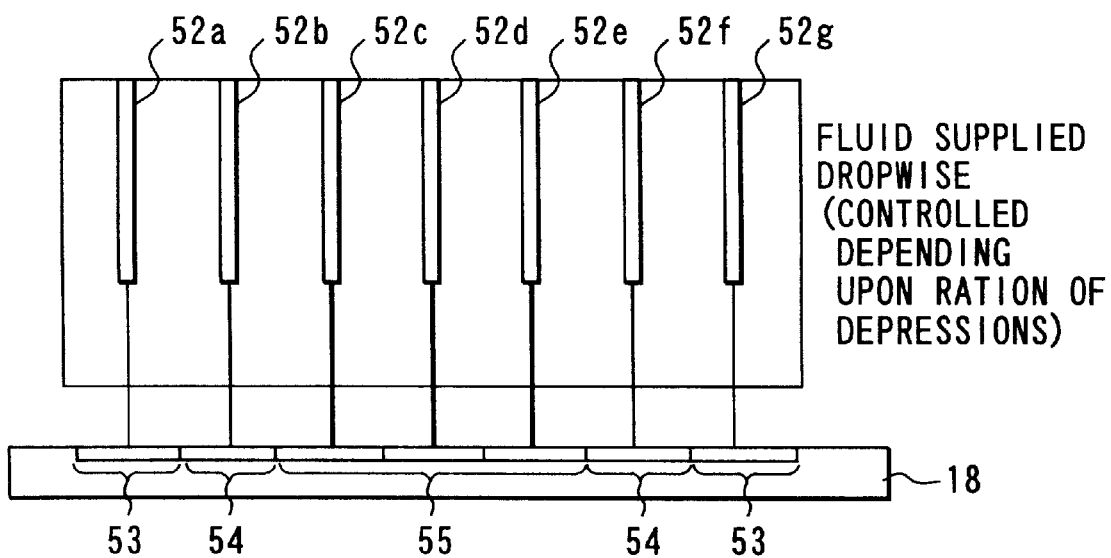
FIG. 35 is a cross-sectional view showing a structure of a coating apparatus having a plurality of liquid supply nozzles.

The coating apparatus of the embodiment has liquid supply nozzles 52a–52g linearly arranged in the direction perpendicular to the moving direction (in a line direction if the moving direction is a row direction) as shown in FIG. 35. A liquid deliver pump (not shown) is connected to the upstream side of each of the liquid supply nozzles 52a–52g. The output amount from each of the liquid supply nozzles 52a–52g can be controlled by changing a deliver amount of each of the liquid deliver pumps.

The SOG film was formed by supplying the SOG solution from the liquid supply nozzles 52a–52g in different amounts depending upon the ratio of the depressed portion on the substrate 18. Regions 53, 54, 55 indicate the areas whose ratios of the depressed portion are small, medium and large. The deliver amount of the liquid deliver pump can be modified in accordance with Equation (2) depending upon the ratio of the depressed portion arithmetically obtained on the basis of the pattern design data of the substrate 18.

For example, when a film was formed on the depressed pattern (shown in FIG. 36), the output amount was controlled as follows. In the case where the ratio of the depressed portion was 75%, the output amount was set at 2.19 $\mu$l/sec. If the ratios were 50% and 12%, the output amounts were set at 1.87 $\mu$l/sec and 1.40 $\mu$l/sec. In FIG. 36, the regions 64a–64g correspond to the regions whose surfaces are coated with the SOG solutions supplied from the liquid supply nozzles 52a–52g, respectively.

The SOG solutions output from the liquid supply nozzles 52a–52g spread with the passage of time and finally formed a film of about 100 $\mu$m in width. After completion of coating with the SOG solution, the surface of the SOG liquid film formed on the substrate 18 was flat. The surface level of the SOG liquid film, that is the height from the surface of the substrate (not from the pattern such as wiring), did not change depending upon the regions. Thereafter, the substrate 18 was further moved horizontally back and forth by about 2 mm to allow the SOG solution to move free during next vaporizing process.

The solvent is allowed to slowly vaporize to form a SiO$_2$ film 56 as shown in FIG. 37. As a result, the surface of the substrate was further flattened. The film thickness of the SiO$_2$ film 56 formed on the pattern was 0.25 $\mu$m. The film thickness of the SiO$_2$ film 56 formed on the depressed portion was 0.50 $\mu$m. The difference between the projecting portion and the depressed portion on the was about 5 nm. Therefore, it is demonstrated that the SiO$_2$ film 25 having a flat surface was formed on the substrate 18.

Furthermore, in the same manner as in the sixth embodiment, an antireflection film having an antireflection effect against DUV light (wavelength: 248 nm) was formed on the SiO$_2$ film in a film thickness of 50 nm. Since the antireflection film is necessary to form uniformly on the slightly uneven substrate 18, the output amount of the liquid to the depressed portion was set at an amount lower by 1% than the standard amount. The output amount of the liquid to the projecting portion was set at an amount higher by 1% than the standard amount. This is made on the presumption that the film thickness of the depressed portion may be increased by free-flow movement of the solution after film formation process. To the projecting portion, a larger amount of the solution was given in advance by the amount corresponding to a loss in film thickness, which presumably lose by the free-flow movement during the film formation process.

Subsequently, using the same manner as in the case of the antireflection film formation, a resist film was formed on the antireflection film in a film thickness of 0.25 $\mu$m. The solid matter for the antireflection film was set at 1% (viscosity 1.5 cp). The solid matter for the resist film was 3% (viscosity: 1.7 cp). Furthermore, light exposure, PEB, and development are performed to form a resist pattern having a wiring width of 0.25 $\mu$m. As described, the surface of the substrate was flattened with high accuracy. The antireflection film and the resist film were formed depending upon the projections and depressions. As a result, the pattern whose wiring width was controlled within 3 nm was successfully obtained.

Note that the present invention is not limited to the aforementioned embodiments. In the aforementioned embodiments, the diluted SOG solution is used as the liquid; however, the liquid is not limited to this. An antireflection film, a conducting film and a resist film to be used in lithographic process, can be formed in the same manner. To form these films, raw materials were diluted with thinner. The solid matter contained therein is desirably 3% or less. Furthermore, the present invention is applicable to the film formation using a metal paste as a wiring material.

A plurality of liquid supply nozzles used in the embodiments may be arranged at appropriate intervals or at the same intervals as those of chips. In this case, since the liquid is supplied so as to fill the same difference between the projecting portion and the depressed portion as that of chips, the output amounts of the liquid supply nozzles can be integrally controlled, with the result that operational convenience can be dramatically increased.

In the aforementioned embodiments, the liquid supply nozzle is moved. However, the substrate may be moved, while the position of the liquid supply nozzle is fixed. Alternatively, both the liquid supply nozzle and the substrate may be moved. The movement direction is not limited to those shown in the embodiments. They may be moved in such a way that the liquid output from the nozzle draws a spiral.

The extend of liquid spread can be controlled by controlling the solid matter contained in the liquid, the viscosity or output speed of the liquid, and a moving speed of the substrate or the liquid supply nozzle.

The present invention can be carried out by modifying it in various ways within the gist thereof.

As explained in the foregoing, according to the sixth and seventh embodiments, a liquid is efficiently coated on a processing surface of a substrate by relatively moving the substrate and a spray nozzle while the liquid is continuously output to the substrate. Furthermore, it is possible to form a coating film the entire surface of which is flat by changing the moving speed, the moving pitch of the nozzle, or the output amount of the liquid depending upon the ratio of the depressed portion of the substrate.

If the sixth and seventh embodiments are used, it is possible to provide a film formation method of coating a liquid film on the substrate efficiently in a uniform thickness (thickness from the substrate surface but not from the pattern) without any influence from the uneven pattern formed on the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a liquid film on a substrate having projections and depressions on a surface of the substrate, comprising:

a first step of continuously outputting a liquid from a liquid output nozzle;

a second step of detecting a ratio of projections and depressions in a predetermined region on the substrate; and a third step of varying an amount of the liquid to be supplied to the predetermined region depending upon the detected ratio of projections and depressions while moving the liquid output nozzle relative to the substrate.

2. The method according to claim 1, wherein, in the third step, an amount of the liquid is varied by changing a speed of the liquid output nozzle relative to the substrate while an amount of the liquid output from the liquid output nozzle is set at a constant amount.

3. The method according to claim 1, wherein, in the third step, an amount of the liquid is varied by changing an amount of the liquid to be shut out by using a liquid shut-out portion interposed between the liquid output nozzle and the substrate.

4. The method according to claim 1, wherein, in the third step, an amount of the liquid is varied by a combination of supplying the liquid continuously output from the liquid output nozzle, dropwise and linearly in a moving direction of the nozzle and shutting out the supply of the liquid by use of a liquid shut-out portion interposed between the liquid output nozzle and the substrate.

5. The method according to claim 1, wherein, in the third step, an amount of the liquid is varied by changing an output amount of the liquid from the liquid output nozzle.

6. The method according to claim 5, wherein the output amount is varied by changing a flow rate of the liquid sent from a supply pump arranged at an upstream side of the liquid output nozzle.

7. The method according to claim 1, wherein, in the second step, the ratio of projections and depressions in the predetermined region is obtained on the basis of a patterning data of the substrate.

8. The method according to claim 1, wherein, in the second step, the ratio of projections and depressions in the predetermined region is obtained by use of a surface image of the predetermined region on the substrate taken by an image taking portion arranged in front of a moving direction of the liquid output nozzle.

9. The method according to claim 1, wherein the liquid comprises a liquid solvent containing any one of a low-dielectric material, insulating material, anti-reflection material, resist material, and wiring material.

10. A method of forming a liquid film on a substrate having projections and depressions on a surface of the substrate, comprising:

a first step of continuously outputting a liquid from a liquid output nozzle;

a second step of detecting a ratio of projections and depressions in first and second regions on the substrate;

a third step of varying an amount of the liquid to be supplied to the first region depending upon the detected ratio of projections and depressions in the first region, while moving the liquid output nozzle relative to the substrate, the liquid being spread over the first region, leading to a first linear liquid film;

a fourth step of varying an amount of the liquid to be supplied to the second region depending upon the detected ratio of projections and depressions in the second region while moving the liquid output nozzle relative to the substrate, the liquid being spread over the second region, leading to a second linear liquid film, and the second linear liquid film being formed in contact with the first linear liquid film.

11. The method according to claim 10, wherein in the third and fourth steps, an amount of the liquid is varied by changing a speed of the liquid output nozzle relative to the substrate while an amount of the liquid output from the liquid output nozzle is set at a constant amount.

12. The method according to claim 10, wherein, in the third and fourth steps, an amount of the liquid is varied by changing an amount of the liquid to be shut out by using a liquid shut-out portion interposed between the liquid output nozzle and the substrate.

13. The method according to claim 10, wherein, in the third and fourth steps, an amount of the liquid is varied by a combination of supplying the liquid output continuously from the liquid output nozzle, dropwise and linearly in a moving direction of the nozzle and shutting out the supply of the liquid by use of a liquid shut-out portion interposed between the liquid output nozzle and the substrate.

14. The method according to claim 10, wherein, in the third and fourth steps, an amount of the liquid is varied by changing an output amount of the liquid output from the liquid output nozzle.

15. The method according to claim 14, wherein the output amount is varied by changing a flow rate of the liquid sent from a supply pump arranged at an upstream side of the liquid output nozzle.

16. The method according to claim 10, wherein, in the second step, the ratio of projections and depressions in the first and second regions are obtained on the basis of a patterning data of the substrate.

17. The method according to claim 10, wherein, in the second step, the ratio of projections and depressions in the first region is obtained by use of a surface image of the first region on the substrate and the ratio of projections and depressions in the second region is obtained by use of a surface image of the second region on the substrate taken by an image taking portion arranged in front of a moving direction of the liquid output nozzle.

18. The method according to claim 10, wherein the liquid comprises a liquid solvent containing any one of a low-dielectric material, insulating material, anti-reflection material, resist material, and wiring material.

19. A method of forming a liquid film on a substrate having projections and depressions on a surface of the substrate, comprising:

a first step of continuously outputting a liquid from a liquid output nozzle;

a second step of detecting a ratio of projections and depressions in a predetermined region on the substrate;

a third step of repeating a supply and a shut-out of the liquid supply to the predetermined region depending upon the ratio of projections and depressions while moving the liquid output nozzle relative to the substrate.

20. The method according to claim 19, wherein, in the second step, the ratio of projections and depressions in the predetermined region is obtained on the basis of a patterning data of the substrate.

21. The method according to claim 19, wherein, in the second step, the ratio of projections and depressions in the predetermined region is obtained by use of a surface image of the predetermined region on the substrate taken by an image taking portion arranged in front of a moving direction of the liquid output nozzle.

22. The method according to claim 19, wherein the liquid comprises a liquid solvent containing any one of a low-dielectric material, insulating material, anti-reflection material, resist material, and wiring material.

* * * * *